US006307085B1

(12) United States Patent
Grasshoff et al.

(10) Patent No.: US 6,307,085 B1
(45) Date of Patent: Oct. 23, 2001

(54) PROCESS AND COMPOSITION FOR GENERATION OF ACID

(75) Inventors: Jurgen M. Grasshoff, Hudson; John L. Marshall, Somerville; Richard A. Minns, Arlington; Socorro M. Ramos, North Andover; Stephen G. Stroud, Medford; Stephen J. Telfer, Arlington; Haixin Yang, Norwood; Roger A. Boggs, Wayland; Eric S. Kolb, Acton, all of MA (US)

(73) Assignee: Polaroid Corporation, Cambridge, MA (US)

(*) Notice: Subject to any disclaimer, the term of this patent is extended or adjusted under 35 U.S.C. 154(b) by 32 days.

(21) Appl. No.: 09/627,939

(22) Filed: Jul. 28, 2000

Related U.S. Application Data

(62) Division of application No. 09/210,101, filed on Dec. 11, 1998, now Pat. No. 6,242,154, which is a division of application No. 08/944,284, filed on Oct. 6, 1997, now Pat. No. 5,914,213, which is a continuation-in-part of application No. 08/757,195, filed on Nov. 27, 1996, now Pat. No. 6,110,638.

(51) Int. Cl.$^7$ ........................................... C07F 9/02
(52) U.S. Cl. ........................................... 558/208; 558/194
(58) Field of Search .................................. 558/194, 208

(56) References Cited

U.S. PATENT DOCUMENTS

| | | | |
|---|---|---|---|
| 3,915,706 | 10/1975 | Limburg et al. ............... 96/27 R |
| 3,932,514 | 1/1976 | Thelen et al. ............... 260/586 P |
| 4,345,017 | 8/1982 | Cournoyer et al. ............... 430/221 |
| 4,602,263 | 7/1986 | Borrer et al. ............... 346/201 |
| 4,720,449 | 1/1988 | Borrer et al. ............... 430/338 |
| 4,826,976 | 5/1989 | Borrer et al. ............... 544/58.4 |
| 4,992,571 | 2/1991 | Fukuyama et al. ............... 566/64 |
| 5,055,376 | 10/1991 | Saeva ............... 430/270 |
| 5,153,104 | 10/1992 | Rossman et al. ............... 430/340 |
| 5,153,105 | 10/1992 | Sher et al. ............... 430/336 |
| 5,219,703 | 6/1993 | Bugner et al. ............... 430/200 |
| 5,258,274 | 11/1993 | Helland et al. ............... 430/522 |
| 5,258,540 | * 11/1993 | Dubs et al. ............... 558/194 |
| 5,286,612 | 2/1994 | Telfer ............... 430/335 |
| 5,314,795 | 5/1994 | Helland et al. ............... 430/517 |
| 5,334,489 | 8/1994 | Grasshoff et al. ............... 430/335 |
| 5,395,736 | 3/1995 | Grasshoff et al. ............... 430/270 |
| 5,401,619 | 3/1995 | Boggs et al. ............... 430/343 |
| 5,422,230 | 6/1995 | Boggs et al. ............... 430/338 |
| 5,441,850 | 8/1995 | Marshall et al. ............... 430/336 |
| 5,445,917 | 8/1995 | Grasshoff et al. ............... 430/270 |
| 5,451,478 | 9/1995 | Boggs et al. ............... 430/11 |
| 5,453,345 | 9/1995 | Grasshoff et al. ............... 430/270 |
| 5,534,388 | 7/1996 | Grasshoff et al. ............... 430/338 |
| 5,534,393 | 7/1996 | Grasshoff et al. ............... 430/348 |
| 5,578,424 | 11/1996 | Grasshoff et al. ............... 430/333 |
| 5,582,956 | 12/1996 | Ehret et al. ............... 430/337 |
| 5,631,118 | 5/1997 | Gaudiana et al. ............... 430/270.1 |
| 5,637,747 | * 6/1997 | Bronstein et al. ............... 558/194 |
| 5,667,943 | 9/1997 | Boggs et al. ............... 430/343 |
| 5,763,134 | 6/1998 | Busman et al. ............... 430/157 |

FOREIGN PATENT DOCUMENTS 8-248561    9/1996  (JP) .

OTHER PUBLICATIONS

Crivello et al., J. Polym. Sci., Polym. Chem Ed., 16, 2441 (1978).
Davies et al., Tetrahedron, 18, 751 (1962).
Devoe et al., Can. J. Chem., 66, 319 (1988).
Gabish, J. Org. Chem. 26, 4165 (1961).
Hirata et al., J. Org. Chem., 36, 412 (1971).
Ito et al., Polymer Sci. Eng., 23(18), 1012 (1983).
Krohnke, Synthesis, 1976, 1.
Mitchell, R.D. et al., J. Imag. Sci., 30(5), 215 (1986).
Ohe, Y. et al., J. Imag. Sci. Tech., 37(3), 250 (1993).
Reichmanis et al., Chemical Amplification Mechanism for Microlithography, Chem. Mater., 3(3), 394 (1991).
Story, J. Org. Chem., 26, 287 (1961).
Wallraff, G.M. et al., J. Imag. Sci. Tech., 36(5), 468 (1992).

* cited by examiner

Primary Examiner—Deborah C. Lambkin
(74) Attorney, Agent, or Firm—Tim A. Cheatham; Gaetano D. Maccarone

(57) ABSTRACT

A process for generation of acid uses a medium comprising a first acid-generating component capable of generating a first acid, and a secondary acid generator, this secondary acid generator being capable of thermal decomposition to form a secondary acid, the thermal decomposition of the secondary acid generator being catalyzed by the first acid. At least part of the medium is exposed to so as to cause formation of the first acid from the first acid-generating component; and the medium is then heated to cause, in the exposed part of the medium, acid-catalyzed thermal decomposition of the secondary acid generator and formation of the secondary acid. The secondary acid generator has a first site bearing a first leaving group and a second site bearing a second leaving group, the first leaving group being capable of protonation by the first acid, with expulsion of the first leaving group to form a cation which electrophilically adds to an unsaturated reagent bearing a proton at the site of addition and a proton-containing nucleophilic grouping at an adjacent site, following which said proton on the reagent is lost and the second leaving group is displaced by said nucleophilic grouping, the second leaving group, in combination with a proton, forming the secondary acid. Preferred variants of the process are of the types described in U.S. Pat. Nos. 5,286,612; 5,334,489; 5,395,736; 5,441,850 and 5,453,345.

6 Claims, No Drawings

PROCESS AND COMPOSITION FOR GENERATION OF ACID

REFERENCE TO RELATED APPLICATION

This is a division of prior application Ser. No. 09/210,101, filed Dec. 11, 1998, U.S. Pat. No. 6,242,154 which itself is a division of application Ser. No. 08/944,284 filed Oct. 6, 1997, now issued as U.S. Pat. No. 5,914,213, which is itself a continuation-in-part of application Ser. No. 08/757,195 filed Nov. 27, 1996, U.S. Pat. No 6,110,638.

BACKGROUND OF THE INVENTION

This invention relates to a process for generation of acid, and to a medium for use in this process. Preferred forms of the present process are useful for generating images.

Images can be generated by exposing a photosensitive medium to light in an imagewise fashion. Some conventional non-silver halide photosensitive compositions contain molecules which are inherently photosensitive, so that absorption of electromagnetic radiation brings about decomposition of, at most, as many molecules as photons absorbed. However, a dramatic increase in the sensitivity of such photosensitive compositions can be achieved if the absorption of each photon generates a catalyst for a secondary reaction which is not radiation-dependent and which effects conversion of a plurality of molecules for each photon absorbed. For example, systems are known in which the primary photochemical reaction produces an acid (which will hereinafter be called the "primary acid" or "first acid"), and this acid is employed catalytically to eliminate acid-labile groups in a secondary, radiation-independent reaction. Such systems may be used as photo-resists: see, for example, U.S. Pat. Nos. 3,932,514 and 3,915,706; and Ito et al., "Chemical Amplification in the Design of Dry Developing Resist Materials", Polym. Sci. Eng., 23(18), 1012 (1983).

Among the known acid-generating materials for use in this type of process employing secondary, non-radiation dependent reactions are certain diazonium, phosphonium, sulfonium and iodonium salts. These salts, hereinafter referred to as superacid precursors, decompose to produce superacids, i.e., acids with a pKa less than about 0, upon exposure to electromagnetic radiation. Other materials decompose to produce superacids in a similar manner. However, in the absence of a spectral sensitizer, the known superacid precursors decompose to produce superacid only upon exposure to wavelengths which the precursors absorb, which are typically in the short ultraviolet region (below about 280 nm). The use of such wavelengths is often inconvenient, not least because special optical systems must be used.

It is known that various dyes can sensitize the decomposition of superacid precursors upon absorption by the dye of radiation which is not significantly absorbed by the superacid precursor; see, for example, European Patent Application Publication No. 120,601. Unfortunately, however, due to the very low pKa of the superacid, many such dyes are protonated by the superacid, so that no unbuffered superacid is produced (i.e., the sensitizing dye buffers any superacid produced). Since no unbuffered superacid is released into the medium, decomposition of superacid precursors sensitized by these dyes cannot be used to trigger any secondary reaction which requires the presence of unbuffered superacid.

(The term "unbuffered superacid" is used herein to refer to superacid which is not buffered by the sensitizing dye, and which thus provides an acidic species stronger than that provided by the protonated sensitizing dye. Because of the extreme acidity of superacids and their consequent tendency to protonate even species which are not normally regarded as basic, it is possible, and indeed likely, that "unbuffered superacid" will in fact be present as a species buffered by some component of the imaging medium less basic than the sensitizing dye. However, such buffering by other species may be ignored for the present purposes, so long as superacid is present as an acidic species stronger than that provided by superacid buffered by the sensitizing dye.)

Crivello and Lam, "Dye-Sensitized Photoinitiated Cationic Polymerization", J. Polymer Sci., 16, 2441 (1978) and Ohe and Ichimura, "Positive-Working Photoresists Sensitive to Visible Light III, Poly(tetrahydropyranyl methacrylates) Activated by Dye-Sensitized Decomposition of Diphenyliodonium Salt", J. Imag. Sci., Technol., 37(3), 250 (1993) describe small sub-groups of sensitizing dyes which are sufficiently non-basic that the buffered superacids produced can effect certain acid-catalyzed reactions. However, the need to restrict the choice both of sensitizers and of acid-catalyzed reactions may make it difficult to design an efficient imaging system at a specific desired wavelength.

A variety of non-basic, polycyclic aromatic compounds sensitize decomposition of superacid precursors to produce unbuffered superacid upon exposure to longer wavelengths than the superacid precursors absorb themselves. Such materials are discussed in, for example, DeVoe et al., "Electron Transfer Sensitized Photolysis of 'Onium salts", Can. J. Chem., 66, 319 (1988); Saeva, U.S. Pat. No. 5,055,376; and Wallraff et al., "A Chemically Amplified Photoresist for Visible Laser Imaging", J. Imag. Sci. Technol., 36(5), 468–476 (1992).

U.S. Pat. Nos. 5,286,612 and 5,453,345 describe a process by which a wider variety of dyes than those discussed above may be used together with a superacid precursor to generate free (unbuffered) superacid in a medium. In this process, acid is generated by exposing a mixture of a superacid precursor and a dye to actinic radiation of a first wavelength which does not, in the absence of the dye, cause decomposition of the superacid precursor to form the corresponding superacid, thereby causing absorption of the actinic radiation and decomposition of part of the superacid precursor, with formation of a protonated product derived from the dye; then irradiating the mixture with actinic radiation of a second wavelength, thereby causing decomposition of part of the remaining superacid precursor, with formation of unbuffered superacid. Generation of superacid by exposure to the second wavelength may be sensitized by one of the non-basic, polycyclic aromatic sensitizers mentioned above. (For convenience, the type of process disclosed in this patent will hereinafter be called the '612 process.)

U.S. Pat. Nos. 5,334,489 and 5,395,736 describe processes for the photochemical generation of acid and for imaging using conventional ultra-violet sensitizers; these processes will hereinafter collectively be called the '489 process.

U.S. Pat. No. 5,441,850 and its continuation-in-part, copending application Ser. No. 08/430,420, filed Apr. 29, 1995, now U.S. Pat. No. 5,631,118 (and the corresponding International Application No. PCT/US95/05130, Publication No. WO 95/29068) all describe a variation of the aforementioned '612 process which uses an imaging medium comprising a sensitizing dye having a first form and a second form, the first form having substantially greater absorption in a first wavelength range than the second form.

The medium is exposed to actinic radiation in this first wavelength range while at least part of the sensitizing dye is in its first form so that the sensitizing dye decomposes at least part of a superacid precursor, with formation of unbuffered superacid. The medium is then heated to cause, in the exposed areas, acid-catalyzed thermal decomposition of a secondary acid generator and formation of a secondary acid. This secondary acid brings about a change in absorption of an image dye and thereby forms an image. Finally, in the non-exposed areas of the medium, the sensitizing dye is converted to its second form, thus removing the absorption in the first wavelength range caused by the first form of the sensitizing dye, and lowering the minimum optical density ($D_{min}$) in this wavelength range. (For convenience, the type of process disclosed in this patent and these applications will hereinafter be called the '850 process.)

The entire disclosures of the aforementioned U.S. Pat. Nos. 5,286,612; 5,453,345; 5,334,489; 5,395,736 and 5,441,850 and copending application Ser. No. 08/430,420 are herein incorporated by reference.

The aforementioned '612, '489 and '850 processes all make use of a secondary acid generator, the thermal decomposition of which is catalyzed by the unbuffered superacid produced in the primary, radiation-dependent reaction. In effect, the secondary acid generator acts as an "acid amplifier" which causes the generation of multiple moles of the secondary acid from each mole of unbuffered superacid produced in the primary reaction, and thus increases the sensitivity of the medium, as compared with a medium relying only upon the generation of unbuffered superacid. The specific preferred secondary acid generators described in these processes are esters of squaric and oxalic acids. In these esters, a basic site is protonated by the first acid, and thereafter a leaving group is released from this first site, leaving an acidic proton at the site. For example, in the squaric acid diester of the formula:

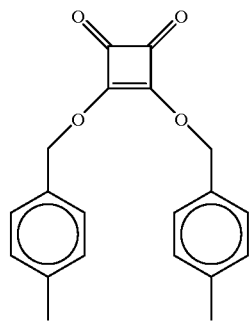

protonation occurs at one of the oxygen atoms, ultimately resulting in the formation of a hydroxyl group attached to the four-membered ring (the proton of this hydroxyl group is of course strongly acidic in squaric acid derivatives).

A secondary acid generator should have high acid sensitivity (i.e., it should readily undergo thermal decomposition in the presence of the first acid), but should also have high thermal stability in the absence of this acid. In the aforementioned squaric and oxalic acid ester secondary acid generators, because the secondary acid-generating reaction involves only a single site, it is difficult to improve the acid sensitivity of the secondary acid generator by chemical modifications without adversely affecting its thermal stability, and vice versa.

Moreover, in the aforementioned squaric and oxalic acid ester secondary acid generators, the secondary acid released is incapable of protonating the secondary acid generator (or, in more strictly accurate thermodynamic terms, the equilibrium proportion of secondary acid generator protonated by the secondary acid is so low as to have a negligible effect on the decomposition of the secondary acid generator). If such protonation of the secondary-acid generator by the secondary acid could be made to occur, the thermal decomposition of the secondary acid generator would also be catalyzed by the secondary acid, and thus this thermal decomposition would be autocatalytic. Such autocatalytic thermal decomposition is desirable in practice because the number of moles of secondary acid which can be generated directly from a single mole of unbuffered superacid is limited (presumably by factors such as, for example, the limited rate of diffusion of secondary acid generator through the polymeric binders which are usually used in imaging media of the aforementioned types) and autocatalytic thermal decomposition can increase the number of moles of secondary acid generated from a single mole of superacid, and thus increase the sensitivity of the imaging medium.

Applicants have developed secondary acid generators in which the secondary acid-forming reaction involves two separate sites within the molecule; such secondary acid generators can comprise a first site having a relatively basic "trigger" group which is first protonated by the superacid with a second site bearing a leaving group which forms a strong secondary acid. Some of the secondary acid generators developed by applicants undergo autocatalytic thermal decomposition.

SUMMARY OF THE INVENTION

Accordingly, this invention provides a process for generation of acid, which process comprises:

providing a medium comprising a first acid-generating component, the first acid-generating component being capable of generating a first acid, and a secondary acid generator, this secondary acid generator being capable of thermal decomposition to form a secondary acid, the thermal decomposition of the secondary acid generator being catalyzed by the first acid;

in at least part of the medium, causing formation of the first acid from the first acid-generating component; and thereafter heating the medium to cause, in said part of the medium, acid-catalyzed thermal decomposition of the secondary acid generator and formation of the secondary acid, wherein the secondary acid generator has a first site bearing a first leaving group and a second site bearing a second leaving group, the first leaving group being capable of protonation by the first acid, with expulsion of the first leaving group, followed by loss of a proton from the secondary acid generator to form an unstable intermediate, which then fragments with loss of the second leaving group, accompanied by either (a) loss of a second proton; or (b) addition of a proton-containing nucleophile, followed by loss of a proton, the second leaving group, in combination with a proton, forming the secondary acid.

Accordingly, this invention provides a process for generation of acid, which process comprises:

providing a medium comprising a first acid-generating component, the first acid-generating component being capable of generating a first acid, and a secondary acid generator, this secondary acid generator being capable of thermal decomposition to form a secondary acid, the thermal decomposition of the secondary acid generator being catalyzed by the first acid;

in at least part of the medium, causing formation of the first acid from the first acid-generating component; and thereafter heating the medium to cause, in said part of the medium, acid-catalyzed thermal decomposition of the secondary acid generator and formation of the secondary acid, wherein the secondary acid generator has a first site bearing a first leaving group and a second site bearing a second leaving group, the first leaving group being capable of protonation by the first acid, with expulsion of the first leaving group to form a cation which electrophilically adds to an unsaturated reagent bearing a proton at the site of addition and a proton-containing nucleophilic grouping at an adjacent site, following which said proton on the reagent is lost and the second leaving group is displaced by said nucleophilic grouping, the second leaving group, in combination with a proton, forming the secondary acid.

This invention also provides a medium for generation of acid, which medium comprises:

a first acid-generating component, the first acid-generating component being capable of generating a first acid; and a secondary acid generator capable of thermal decomposition to form a secondary acid, the thermal decomposition of the secondary acid generator being catalyzed by the first acid, wherein the secondary acid generator has a first site bearing a first leaving group and a second site bearing a second leaving group, the first leaving group being capable of protonation by the first acid, with expulsion of the first leaving group, followed by loss of a proton from the secondary acid generator to form an unstable intermediate, which then fragments with loss of the second leaving group, accompanied by either (a) loss of a second proton; or (b) addition of a proton-containing nucleophile, followed by loss of a proton, the second leaving group, in combination with a proton, forming the secondary acid.

This invention also provides a medium for generation of acid, which medium comprises:

a first acid-generating component, the first acid-generating component being capable of generating a first acid; and a secondary acid generator capable of thermal decomposition to form a secondary acid, the thermal decomposition of the secondary acid generator being catalyzed by the first acid, wherein the secondary acid generator has a first site bearing a first leaving group and a second site bearing a second leaving group, the first leaving group being capable of protonation by the first acid, with expulsion of the first leaving group to form a cation which electrophilically adds to an unsaturated reagent bearing a proton at the site of addition and a proton-containing nucleophilic grouping at an adjacent site, following which said proton on the reagent is lost and the second leaving group is displaced by said nucleophilic grouping, the second leaving group, in combination with a proton, forming the secondary acid.

This invention also provides a process for generation of acid, which process comprises:

providing a medium comprising a first acid-generating component, the first acid-generating component being capable of generating a first acid, and a secondary acid generator capable of thermal decomposition to form a secondary acid, the thermal decomposition of the secondary acid generator being catalyzed by the first acid, the thermal decomposition of the secondary acid generator also being catalyzed by the secondary acid;

in at least part of the medium, causing formation of the first acid from the first acid-generating component; and thereafter heating the medium to cause, in said part of the medium, acid-catalyzed thermal decomposition of the secondary acid generator and formation of the secondary acid.

This invention also provides a medium for generation of acid, which medium comprises:

a first acid-generating component, the first acid-generating component being capable of generating a first acid; and a secondary acid generator capable of thermal decomposition to form a secondary acid, the thermal decomposition of the secondary acid generator being catalyzed by the first acid, the thermal decomposition of the secondary acid generator also being catalyzed by the secondary acid.

This invention provides a secondary acid generator of the formula:

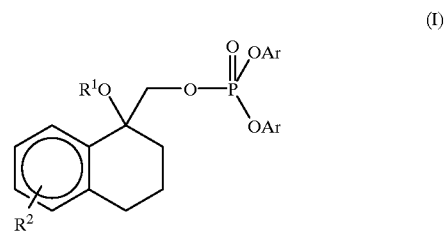

(I)

wherein Ar is an aryl group, with the two aryl groups being the same or different, $R^1$ is an alkyl or cycloalkyl group, and $R^2$ represents one or more hydrogen atoms or alkyl, aryl, alkoxy or aryloxy groups substituted on the benzene ring.

In Formula I, $R^1$ is desirably an alkyl group, and desirably each group Ar is a phenyl, 4-methoxyphenyl, 4-phenylphenyl or 4-(4-phenylphenoxy)phenyl group. A specific preferred secondary acid generator of Formula I is (1-methoxy-1,2,3,4-tetrahydronaphthalen-1-yl)methyl diphenylphosphate.

Finally, this invention provides a secondary acid generator of the formula:

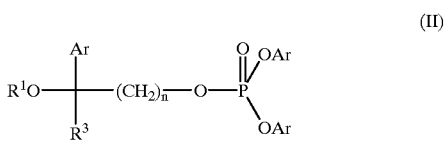

(II)

wherein Ar is an aryl group, with the three aryl groups being the same or different, $R^1$ is an alkyl or cycloalkyl group, $R^3$ is an alkyl or cycloalkyl group, and n is 1 or 2.

In Formula II, $R^1$ and $R^3$ are each desirably an alkyl group, and desirably each group Ar is a phenyl, 4-methoxyphenyl, 4-phenylphenyl or 4-(4-phenylphenoxy) phenyl group. Specific preferred secondary acid generators of Formula II are:

(a) 3-methoxy-3-(4-phenylphenyl)but-1-yl bis(4-phenylphenyl)phosphate, the compound in which n is 2, $R^1$ and $R^3$ are each a methyl group, and each group Ar is a 4-phenylphenyl group;

(b) 2-methoxy-2-[4-(4-phenylphenoxy)phenyl]but-1-yl diphenylphosphate, the compound in which n is 1, $R^1$ is a methyl group, $R^3$ is an ethyl group, the group Ar attached to the same carbon atom as the group $R^3$ is a 4-(4-phenylphenoxy)phenyl group, and the other two groups Ar are phenyl groups; and (c) 2-methoxy-2-[4-(4-methoxyphenyl)phenyl]but-1-yl diphenylphosphate, the compound in which n is 1, $R^1$ is a methyl group, $R^3$ is an ethyl group, the group Ar attached to the same carbon atom as the group $R^3$ is a 4-(4-methoxyphenyl)phenyl group, and the other two groups Ar are phenyl groups.

DETAILED DESCRIPTION OF THE INVENTION

As already mentioned, the process of the present invention differs from the '612, '489 and '850 processes, and other processes using secondary acid generators, in that the secondary acid generator used has a first (or "trigger") site bearing a first leaving group and a second site bearing a second leaving group. In the present process, the first leaving group is protonated by the first acid, leading to expulsion of the first leaving group. Loss of the first leaving group is followed by loss of a proton from the secondary acid generator to form an unstable intermediate. This intermediate fragments, with loss of the second leaving group. There also occurs, simultaneously with or after loss of the second leaving group, either the loss of a proton from the unstable intermediate, or addition of a proton-containing nucleophile to the unstable intermediate, followed by loss of a proton. The second leaving group, in combination with a proton, forms the secondary acid.

Skilled chemists will appreciate that the use of a secondary acid generator having two separate active sites allows an additional degree of freedom in controlling the properties of the secondary acid generator. In particular, the first leaving group can be chosen relatively basic, so as to be readily protonated, while the second leaving group can be chosen to produce a strong secondary acid. For example, the first leaving group can be a hydroxyl group, which is readily protonated and then lost as water (which is essentially non-acidic, at least in the polymeric media in which the present process is typically carried out), while the second leaving group can be a tosyloxy group, which produces p-toluenesulfonic acid as the secondary acid, this being a much more powerful acid than the squaric and oxalic acid derivatives produced by the prior art processes discussed above.

The two steps in the decomposition of the secondary acid generator (i.e., the loss of the first leaving group, and the loss of the second leaving group) will of course normally proceed at different rates. Although the present invention is not limited to any particular relationship between these rates, in general it is desirable that the second step be slower than the first. If the second step is relatively slow, and minor amounts of thermal decomposition of the primary acid generator occur during storage, such thermal decomposition will not necessarily cause generation of secondary acid from the secondary acid generator, and subsequent catalyzed breakdown of more secondary acid generator molecules.

By appropriate choice of the first and second leaving groups, the secondary acid can be made sufficiently strong to be capable of protonating the first leaving group of the secondary acid generator. In such cases, the thermal decomposition of the secondary acid generator is catalyzed not only by the primary acid but also by the secondary acid itself, i.e., the thermal decomposition is autocatalytic. Thus, the first few molecules of secondary acid generated from a single molecule of the primary acid can in turn catalyze the decomposition of additional molecules of secondary acid generator to produce additional secondary acid, thereby providing a "cascade reaction" which increases the number of moles of secondary acid generated from a single mole of primary acid, and thereby enhances the sensitivity of the process.

In general, preferred first leaving groups for the secondary acid generators are those comprising a nitrogen, phosphorus, sulfur or oxygen atom bonded directly to the first site, this first leaving group having a $pK_{HA+}$ greater than about $-6$. Examples of such first leaving groups include hydroxy, alkoxy, amino, alkylamino, acyloxy, aroyloxy, acylamino, aroylamino, carbamate and 2-oxopyridyl groups, and groups of the formula $-O-C(=O)-C(=O)-O-R^4$, wherein $R^4$ is an alkyl or aryl group. Preferred second leaving groups are neutral groups having the $pK_{HA}$ of their conjugate acids not greater than about 2, or cationic groups having the $pK_{HA+}$ of their conjugate acids not greater than about 2. The first and second leaving groups may both be attached to a carbocyclic ring containing from 5 to 8 carbon atoms; this carbocyclic ring may be fused to an alicyclic or aromatic ring.

More specifically, a first preferred group of secondary acid generators for use in the present process are 1,2-diol derivatives of the formula:

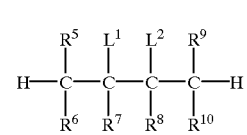

(III)

or of the formula:

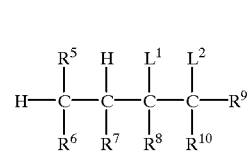

(IV)

wherein $L^1$ is the first leaving group, $L^2$ is the second leaving group, and $R^5$, $R^6$, $R^7$, $R^8$, $R^9$ and $R^{10}$ are each independently a hydrogen atom, an alkyl, cycloalkyl, aralkyl or aryl group, subject to the proviso that any two of $R^5$, $R^6$, $R^7$, $R^8$, $R^9$ and $R^{10}$ may, together with the carbon atom(s) to which they are attached, form a carbocyclic ring. Among the secondary acid generators of Formulae III and IV, an especially preferred subgroup are those of the formula:

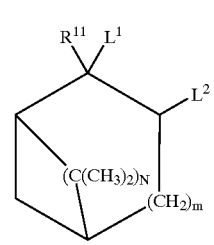

(V)

wherein $L^1$ and $L^2$ are as defined above with reference to Formulae III and IV, $R^{11}$ is an aryl or alkyl group; m is 0, 1, 2 or 3; and N is 0 or 1, subject to the proviso that, when $L^1$ is a hydroxyl group, $L^1$ and $L^2$ are in the cis orientation to one another. Preferred compounds of Formula V are those in which $L^1$ comprises a nitrogen, phosphorus, sulfur or oxygen atom bonded directly to the cyclohexane ring, the group $L^1$ having a $pK_{HA+}$ greater than about −6; and $L^2$ comprises a halo, sulfonium, sulfonate, sulfate, sulfamate or phosphate ester group, especially those in which $R^{11}$ is an aryl group, optionally substituted with at least one halo, alkyl, nitro, alkoxy or aryloxy substituent, or is an alkyl group containing not more than about 6 carbon atoms; $L^1$ is of the formula $OR^{12}$ wherein $R^{12}$ is a hydrogen atom or an acyl group, or a group of the formula —C(=O)—C(=O)—O—$R^{13}$, in which $R^{13}$ is an alkyl or aryl group; $L^2$ is of the formula —$OSO_2R^{14}$, wherein $R^{14}$ is an aryl group, optionally substituted with at least one halo, alkyl, nitro, alkoxy or aryloxy substituent, or is an alkyl group containing not more than about 12 carbon atoms, which may be substituted with an alicyclic group, this alicyclic group optionally bearing an oxo group, or $L^2$ is a diarylphosphate ester group or an N,N-disubstituted sulfamate group wherein each of the substituents independently is an alkyl or aryl group; and m is 0 or 1. Specific preferred secondary acid generators of Formula V are those in which:

(a) $R^{11}$ is a phenyl group, $L^1$ is a hydroxyl group and $L^2$ is a tosyl group; or (b) $R^{11}$ is a p-chlorophenyl, p-methylphenyl, p-phenoxyphenyl or p-methoxyphenyl group, $L^1$ is a hydroxyl group and $L^2$ is a methylsulfonyl group.

Another especially preferred subgroup of the secondary acid generators of Formula III and IV are those of the formula:

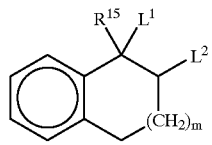

(VI)

wherein $L^1$ and $L^2$ are as defined above with reference to Formulae I and II, $R^{15}$ is an aryl or alkyl group; and m is 0, 1, 2 or 3, subject to the proviso that, when $L^1$ is a hydroxyl group, $L^1$ and $L^2$ are in the cis orientation to one another.

As will be apparent to skilled chemists, the compounds of Formula V and VI exist in optical isomers, since the carbon atom bearing the groups $R^{11}$ (or $R^{15}$) and $L^1$ is an asymmetric center, as is the carbon atom bearing the group $L^2$. Accordingly, the compounds of Formulae V and VI exist in two diastereomeric forms. As already noted, when $L^1$ is a hydroxyl group (and in some cases when $L^1$ is an amino group), the groups $L^1$ and $L^2$ should be in the cis orientation to one another; it does not matter which enantiomer, or mixture of enantiomers is used.

Preferred compounds of Formula VI are those in which $L^1$ comprises a nitrogen, phosphorus, sulfur or oxygen atom bonded directly to the cyclohexane ring, the group $L^1$ having a $pK_{HA+}$ greater than about −6; and $L^2$ comprises a halo, sulfonium, sulfonate, sulfate, sulfamate or phosphate ester group, especially those in which $R^{15}$ is an aryl group, optionally substituted with at least one halo, alkyl, nitro, alkoxy or aryloxy substituent, or is an alkyl group containing not more than about 6 carbon atoms; $L^1$ is of the formula $OR^{16}$ wherein $R^{16}$ is a hydrogen atom or an acyl group, or a group of the formula —C(=O)—C(=O)—O—$R^{17}$, in which $R^{17}$ is an alkyl or aryl group; $L^2$ is of the formula —$OS_2R^{18}$, wherein $R^{18}$ is an aryl group, optionally substituted with at least one halo, alkyl, nitro, alkoxy or aryloxy substituent, or is an alkyl group containing not more than about 12 carbon atoms, which may be substituted with an alicyclic group, this alicyclic group optionally bearing an oxo group, or $L^2$ is a diarylphosphate ester group or an N,N-disubstituted sulfamate group wherein each of the substituents independently is an alkyl or aryl group; and m is 0 or 1. Specific preferred secondary acid generators of Formula VI are those in which $R^{15}$ is a methyl group, $L^1$ is a hydroxyl group and $L^2$ is a p-methylphenylsulfonyl, p-n-butylphenylsulfonyl, p-n-octylphenylsulfonyl group, (7,7-dimethylbicyclo[2.2.1]heptan-2-onyl)methylsulfonyl or N,N-dimethylsulfamate group.

Another preferred group of secondary acid generators for use in the present process are 1,3-diol derivatives of the formula:

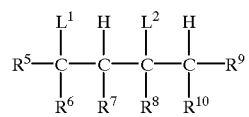

(VII)

or of the formula:

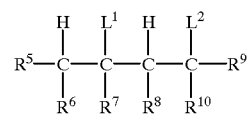

(VIII)

wherein $L^1$ is the first leaving group, $L^2$ is the second leaving group, and $R^5$, $R^6$, $R^7$, $R^8$, $R^9$ and $R^{10}$ are each independently a hydrogen atom, an alkyl, cycloalkyl, aralkyl or aryl group, subject to the proviso that any two of $R^5$, $R^6$, $R^7$, $R^8$, $R^9$ and $R^{10}$ may, together with the carbon atom(s) to which they are attached, form a carbocyclic ring and that this carbocyclic ring may optionally be substituted with an additional second leaving group $L^2$.

An especially preferred subgroup of the secondary acid generators of Formulae VII and VIII are those of the formula:

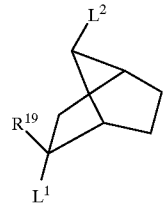

(IX)

wherein $L^1$ is the first leaving group, $L^2$ is the second leaving group and $R^{19}$ is a carbonium ion stabilizing group. Preferred compounds of Formula IX are those in which $L^1$ comprises a nitrogen, phosphorus, sulfur or oxygen atom bonded directly to the cyclohexane ring, the group $L^1$ having a $pK_{HA+}$ greater than about −6; $L^2$ comprises a halo, sulfonium, sulfonate, sulfate, sulfamate or phosphate ester group; and $R^{19}$ is an alkyl, cycloalkyl, aralkyl or aryl group. Desirably $L^1$ is a hydroxy, alkoxy, amino, alkylamino, acyloxy, aroyloxy, acylamino, aroylamino, carbamate and 2-oxopyridyl group or a group of the formula —O—C(=O)—C(=O)—O—R$^{20}$, wherein R$^{20}$ is an alkyl or aryl group; and L$^2$ is a group of the formula —OSO$_2$R$^{21}$ or —S$^+$(R$^{21}$)$_2$X$^-$ (wherein each R$^{21}$ is an aryl group, which may be substituted with at least one halo, alkyl, nitro, alkoxy or aryloxy substituent, or is an alkyl group containing not more than about 12 carbon atoms, which may be substituted with an alicyclic group, this alicyclic group optionally bearing an oxo group, subject to the proviso that when more than one group R$^{21}$ is present, these groups R$^{21}$ may be the same or different), and X is an anion, or L$^2$ is a diarylphosphate ester group or an N,N-disubstituted sulfamate group wherein each of the substituents independently is an alkyl or aryl group. Specific preferred secondary acid generators of this type are those in which L$^1$ is a hydroxyl group, L$^2$ is a tosyloxy group and R$^{19}$ is a 3,5-dichlorophenyl, 4-trifluoromethylphenyl, 4-chlorophenyl, 3-chlorophenyl, phenyl or 4-methylphenyl group.

General methods for the synthesis of each of the aforementioned preferred groups of secondary acid generators are known to skilled organic chemists, and examples of such syntheses are given in the Examples below. Accordingly, the synthesis of these preferred groups of secondary acid generators is well within the skill of trained organic synthetic chemists.

FIGS. 1, 2 and 3 of the accompanying drawings illustrate the reactions occurring during the acid-catalyzed thermal decomposition of three preferred secondary acid generators in the present process. In FIG. 1, a 1-R$^{11}$-1-hydroxy-2-tosyloxycyclohexane secondary acid generator (A) (which is of Formula V with L$^1$ being a hydroxyl group, L$^2$ being a tosyloxy group, m being 1 and n being 0) undergoes protonation of the hydroxyl first leaving group, followed by loss of this group in the form of water to give a carbocation (B). This carbocation (B) undergoes loss of a proton to form an unstable intermediate (C), in which the dotted bonds indicate a double bond between either the 1-carbon of the ring and the group R$^{11}$, or the 1- and 6-carbons of the ring. The unstable intermediate (C) then loses a tosyloxy anion to form a carbocation (D), which then adds a proton-containing nucleophile (designated "NuH") and subsequently loses a proton to form a final 1-R$^{11}$-6-Nu-cyclohex-1-ene (E). Alternatively (not shown in FIG. 1), the carbocation (D) may lose a further proton to form a cyclohexa-1,3-diene product. In either case, the tosyloxy anion, together with one of the protons lost during the reactions, forms a strong secondary acid, namely p-toluenesulfonic acid, which is sufficiently strong to protonate a further molecule of the secondary acid generator (A), so that the thermal decomposition reaction is autocatalytic.

FIG. 2 shows reactions corresponding to those in FIG. 1 where the secondary acid generator is a norbornyl derivative (F) of Formula IX with L$^1$ being a hydroxyl group and L$^2$ being a tosyloxy group. As in FIG. 1, the first step of the thermal decomposition reaction is protonation of the hydroxyl group, followed by loss of this group as water with formation of a carbocation (G). This carbocation (G) loses a proton, with formation of a 2,3-double bond to give an unstable intermediate (H). The intermediate (H) then loses a tosyloxy anion to give a carbocation (I), in which the dashed bonds denote a non-classical three-center bond. Finally, the carbocation (I) adds a proton-containing nucleophile and subsequently loses a proton to form a final 2-R$^{19}$-7-Nu-norbornyl derivative (J).

This sequence of reactions occurs for most nucleophiles NuH. However, if the nucleophile NuH is water (i.e., the nucleophilic group Nu is a hydroxyl group), the 7-hydroxyl derivative (K) first formed is itself unstable and undergoes fragmention, via a carbocation (L), so that the final product is a 3-R$^{19}$-cyclohex-3-ene aldehyde (M).

FIGS. 3A and 3B shows the reactions occurring two alternative pathways for the thermal decomposition of a preferred phosphate ester secondary acid generator. For ease of comprehension, the formulae shown in FIG. 3 are simplified; in FIG. 3, "MeO" denotes a methoxyl group, "Ar" denotes a 4-(4-phenylphenoxy)phenyl group and

denotes a grouping of the formula:

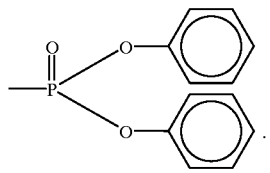

The full formula of this phosphate secondary acid generator is given at Formula (X) below.

As shown in FIG. 3A, the first two steps in the decomposition of the phosphate ester secondary acid generator (N) are protonation of the methoxyl group on the compound (N) to give the carbocation (O), which then loses methanol to give an carbocation intermediate (P). It is at this point that the two pathways for the decomposition diverge, as indicated by the two arrows extending from the intermediate (P) in FIG. 3A. The carbocation intermediate (P) may either lose a proton to give an unsaturated intermediate (Q), in which the dotted bonds have the same significance as in FIG. 1, or may electrophilically add to an unsaturated reagent; the latter possibility is discussed below with reference to FIG. 3B. It will be seen that the intermediate (Q) resembles the corresponding intermediate (C) shown in FIG. 1. However, the next stage of the process differs significantly from those previously described with reference to FIGS. 1 and 2. The intermediate (Q) reacts with a nucleophile (resorcinol is shown in FIG. 3A); the exact steps involved are not clear, but the overall result is expulsion of the phosphate ester grouping as a phosphoric acid (the secondary acid), and the formation of a cyclic product (R).

Alternatively, as shown in FIG. 3B, the carbocation intermediate (P) may effect electrophilic addition to an unsaturated reagent (resorcinol is shown in FIG. 3B) bearing a proton at the site of the addition and also bearing a proton-containing nucleophilic grouping at an adjacent site (which need not necessarily be α to the addition site). In the case of resorcinol, the addition takes place at the 4-position, which is ortho to one hydroxyl group and para to the other, and hence highly activated for the electrophilic addition, while the ortho hydroxyl group serves as the proton-containing nucleophilic grouping. The electrophilic addition is of course accompanied by loss of the original 4-proton of the resorcinol (omitted from FIG. 3B for the sake of simplicity), and the addition species produced is designated (S).

As indicated in Formula (S) in FIG. 3B, the final step of this pathway is a cyclization reaction resulting from nucleophilic attack of a lone pair from the "ortho" hydroxyl group on the carbon atom α to the addition site and expulsion of the phosphate ester grouping as a phosphoric acid (the secondary acid), and the formation of same cyclic product (R) as shown in FIG. 3A.

As shown in FIGS. 3A and 3B, the specific secondary acid generator (N) illustrated can undergo decomposition by either pathway. However, there are certain secondary acid generators which, it appears, must undergo the electrophilic addition route of FIG. 3B, since there is no proton available to permit the elimination reaction to form the unsaturated compound corresponding to (Q) in FIG. 3A. For example, the secondary acid generator of the formula:

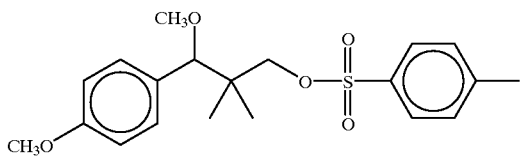

clearly cannot undergo the elimination reaction corresponding to (P)→(Q) in FIG. 3A after loss of methanol from the carbon atom between the benzene ring and the —C(CH$_3$)$_2$— grouping. In other cases, although the elimination reaction is at least theoretically possible, little secondary acid formation is observed in the absence of the appropriate nucleophilic reagent, so that, in the presence of this reagent, the reaction must be proceeding predominantly via the electrophilic addition/cyclization route of FIG. 3B.

The use of secondary acid generators which proceed wholly or predominantly via the electrophilic addition/cyclization route of FIG. 3B is generally advantageous in that such secondary acid generators will not generate acid in the absence of the nucleophilic reagent. As discussed in more detail, in practice imaging media of the present invention typically use two separate layers, an acid-generating layer containing the acid-generating component and the secondary acid generator, and a color-forming layer containing the leuco form of an image dye which changes color in the presence of the secondary acid; the components of the two layers are intermixed by heating the medium after imagewise exposure. In such two-layer media, the nucleophilic reagent required for the secondary acid generator to generate the secondary acid can be placed in the color-forming layer. Accordingly, even if trace amounts of first acid are generated in the acid-generating layer prior to the exposure (for example, because of exposure of the medium to minor amounts of radiation during handling, or because of slight thermal stability of the acid-generating component or the secondary acid generator), these trace amounts of acid will not be amplified by the secondary acid generator and no significant amount of acid will be present in the medium prior to imaging, thus reducing the minimum optical density ($D_{min}$) in the final image. In effect, the electrophilic addition/cyclization type secondary acid generator and the nucleophilic reagent form a two-component secondary acid generator, which is only "assembled", and thus able to effect acid amplification, after imaging has taken place. Thus, this type of secondary acid generator tend to enhanced the thermal stability of the medium during storage, while still permitting high amplification factors to be achieved (i.e., a large number of moles of secondary acid to be generated for each mole of primary acid generated from the acid generator).

The secondary acid generators used in the process of the present invention may have multiple second leaving groups. In certain structures, the departure of a "primary" second leaving group adjacent the first leaving group may cause a change in structure of the secondary acid generator (for example, the formation of a C=C double bond) which destabilizes a "secondary" second leaving group more remote from the first leaving group, thereby triggering departure of this secondary second leaving group, with formation of a second molecule of the secondary acid. Obviously, the departure of the secondary second leaving group may cause a similar change in structure firther along the molecule, thereby destabilizing a "tertiary" second leaving group, with formation of a third molecule of the secondary acid. The use of secondary acid generators containing multiple second leaving groups may be advantageous because protonation of only one first site on the secondary acid generator is required to cause departure of multiple second leaving groups, thereby increasing the number of protons generated from each protonation and increasing the "amplification factor" (i.e., the number of moles of secondary acid generated from each mole of primary acid) of the secondary acid generator.

As already mentioned, the second step in the decomposition of the secondary acid generator may involve, in addition to the loss of the second leaving group, either loss of a second proton or addition of proton-containing nucleophile to the secondary acid generator, followed by loss of a proton. Where the second leaving group comprises a phosphate ester, it is desirable to have a nucleophile present with or adjacent the secondary acid generator so that the second step can proceed by the latter route; appropriate nucleophiles include phenols (especially resorcinol), thiophenols, thiols and phosphines. The nucleophile may be provided either in the same layer as the secondary acid generator or be introduced later, normally by diffusion from an adjacent layer; later introduction is preferred since there is less risk of unintentional acid generation during storage of the medium.

The generation of the first acid in the present process may be effected by any means capable of generating an acid from an acid-generating component, for example thermal decomposition of the acid-generating component, or contact with a reagent which decomposes the acid-generating component to produce the first acid. However, in general it is preferred that the generation of the first acid be effected by the action of electromagnetic radiation on the first acid-generating component. Preferred radiation sensitive acid-generating components include phosphonium, sulfonium, diazonium and iodonium salts capable of decomposing to give a first acid with a pK$_a$ less than about 0. Especially preferred superacid precursors are diaryliodonium salts, specifically (4-octyloxyphenyl)phenyliodonium hexafluorophosphate and hexafluoroantimonate, bis(n-dodecylphenyl)iodonium hexafluoroantimonate and (4-(2-hydroxytetradecan-1-yloxy)phenyl)phenyl iodonium hexafluoroantimonate. Whether or not 'onium salts are employed as the acid-generating component, it may often be desired to generate the first acid using radiation of a wavelength to which the first acid-generating component is not inherently sensitive, and for this purpose to include within the medium a sensitizing dye which sensitizes the first acid-generating component to the radiation used.

Similarly, the present invention is not limited to any particular use of the secondary acid generated by the present process, and this acid may be used in various ways, for example by triggering an acid-dependent chemical reaction, such as a cationic polymerization (and hence the present process may be useful in the production of photolithographic masks). However, one preferred use for the present process is the formation of images, and for this purpose the medium desirably contains an acid-sensitive material capable of undergoing a color change in the presence of the secondary acid, so that the secondary acid produced causes the color change in the acid-sensitive material, thereby forming the image. Preferred imaging processes of the present invention include those similar to the aforementioned '489, '612 and '850 processes, especially the last two. Accordingly, one preferred process of the invention for producing an image (this process being of the '612 type) comprises:

providing a medium containing a mixture of a superacid precursor and a sensitizing dye capable of absorbing actinic radiation of a first wavelength which does not, in the absence of the sensitizing dye, cause decomposition of the superacid precursor to form the corresponding superacid, the superacid precursor being capable of being decomposed by actinic radiation of a second wavelength shorter than the first wavelength;

irradiating part of the medium with actinic radiation of the first wavelength, thereby causing, in the irradiated part of the medium, absorption of the actinic radiation, and decomposition of part of the superacid precursor, without formation of unbuffered superacid but with formation of a protonated product derived from the dye; and thereafter irradiating a larger portion of the medium with actinic radiation of the second wavelength, thereby causing, in the part of the medium exposed to the radiation of both the first and second wavelengths, decomposition of part of the remaining superacid precursor, with formation of unbuffered superacid, without generation of unbuffered superacid in the part of the medium exposed to the radiation of the second wavelength but not to the radiation of the first wavelength;

heating the medium containing the unbuffered superacid while the unbuffered superacid is admixed with a secondary acid generator, this secondary acid generator being capable of thermal decomposition to form a secondary acid, the thermal decomposition of the secondary acid generator being catalyzed by unbuffered superacid such that, in the part of the medium irradiated with the actinic radiation of the first wavelength, acid-catalyzed thermal decomposition of the secondary acid generator occurs and secondary acid is formed, whereas the part of the medium not irradiated with the actinic radiation of the first wavelength remains essentially free from the secondary acid; and contacting the secondary acid with an acid-sensitive material which changes color in the presence of the secondary acid, wherein the secondary acid generator has a first site bearing a first leaving group and a second site bearing a second leaving group, the first leaving group being capable of protonation by the first acid, with expulsion of the first leaving group, followed by loss of a proton from the secondary acid generator to form an unstable intermediate, which then fragments with loss of the second leaving group, following which there is either (a) loss of a second proton from the secondary acid generator; or (b) addition of a proton-containing nucleophile to the secondary acid generator, followed by loss of a proton, the second leaving group, in combination with a proton, forming the secondary acid.

A second preferred process of the invention for producing an image (this process being of the '850 type) comprises:

providing an imaging medium comprising an acid-generating layer or phase, said acid-generating layer or phase comprising a mixture of a superacid precursor, a sensitizing dye and a secondary acid generator, and a color-change layer or phase comprising an image dye;

the sensitizing dye having a first form and a second form, the first form having substantially greater absorption in a first wavelength range than the second form;

the superacid precursor being capable of being decomposed to produce superacid by actinic radiation in a second wavelength range different from the first wavelength range, but not, in the absence of the sensitizing dye in its first form, being capable of being decomposed to produce superacid by actinic radiation in the first wavelength range;

the secondary acid generator being capable of thermal decomposition to form a secondary acid, the thermal decomposition of the secondary acid generator being catalyzed by unbuffered superacid; and the image dye undergoing a change in its absorption of radiation upon contact with the secondary acid;

while at least part of the sensitizing dye is in its first form, imagewise exposing the medium to actinic radiation in the first wavelength range, thereby causing, in the exposed areas of the acid-generating layer or phase, the sensitizing dye to decompose at least part of the superacid precursor, with formation of unbuffered superacid;

thereafter, heating the medium to cause, in the exposed areas of the acid-generating layer or phase, acid-catalyzed thermal decomposition of the secondary acid generator and formation of the secondary acid;

admixing the components of the acid-generating and color-change layers or phases, thereby causing, in the exposed areas of the medium, the secondary acid to bring about the change in absorption of the image dye and thereby form the image; and in the non-exposed areas of the medium, converting the sensitizing dye to its second form, wherein the secondary acid generator has a first site bearing a first leaving group and a second site bearing a second leaving group, the first leaving group being capable of protonation by the first acid, with expulsion of the first leaving group, followed by loss of a proton from the secondary acid generator to form an unstable intermediate, which then fragments with loss of the second leaving group, following which there is either (a) loss of a second proton from the secondary acid generator; or (b) addition of a proton-containing nucleophile to the secondary acid generator, followed by loss of a proton, the second leaving group, in combination with a proton, forming the secondary acid.

Apart from the use of a secondary acid generator as described above, the '489 process of the invention is fully described in the aforementioned U.S. Pat. Nos. 5,334,489 and 5,395,736, to which the reader is referred for additional information, and accordingly this process will not be further described in detail herein. Similarly, the '612 process of the invention is fully described in the aforementioned U.S. Pat. Nos. 5,286,612 and 5,453,345, to which the reader is referred for additional information, and accordingly this process will also not be further described in detail herein.

As already mentioned, the '850 process differs from the '489 and '612 processes in that the '850 process uses a sensitizing dye having a first form and a second form, with the first form having substantially greater absorption in a first wavelength range than the second form. The imaging medium used comprises an acid-generating layer or phase comprising a mixture of the first acid-generating component, the sensitizing dye and the secondary acid generator, and a color-change layer or phase comprising an image dye. The medium is imagewise exposed to radiation in the first wavelength range while the -sensitizing dye is in its first form, so that, in the exposed areas, the sensitizing dye causes decomposition of at least part of the superacid precursor, with formation of unbuffered superacid. As explained in more detail below, in some cases, in addition to the imagewise exposure, further steps may be necessary to produce the imagewise distribution of unbuffered superacid required for later steps of the '850 process.

The unbuffered superacid in the exposed areas (in effect, a "latent image" in superacid) produced in the first part of the present process is then used to cause thermal decomposition of the secondary acid generator, in accordance with the present invention. Next, the components of the acid-generating and color-change layers or phases are mixed, thereby causing, in the exposed areas of the medium, the secondary acid to bring about the change in absorption of the image dye and to form the image. (In saying that the components of the acid-generating and color-change layers or phases are mixed, we do not exclude the possibility that these two layers or phases may be merged to form a single layer or phase, but such complete merger is not necessary, since it is only necessary for the secondary acid and the image dye to come into contact, so that the secondary acid can cause the change in absorption of the image dye.) Finally, in at least the non-exposed areas of the imaging medium, the sensitizing dye is converted to its second form. This conversion of the sensitizing dye to its second form essentially removes from the non-exposed areas of the image the absorption of the sensitizing dye in the first wavelength range, and thus allows the imagewise exposure of the medium to be effected using radiation in the same wavelength range as that in which the image is viewed; at least the non-exposed areas of the final image do not absorb at the wavelength at which imaging is effected.

Conversion of the sensitizing dye from its first to its second form may be effected by any technique capable of converting a dye from a first form having a substantial absorption in the desired wavelength range to a second form having substantially less absorption in this wavelength range. However, this conversion should be such as not to adversely affect the image, either by significantly decreasing the maximum optical density ($D_{max}$) of the exposed regions or by introducing unwanted color into the regions where the sensitizing dye finally remains in its second form. In addition, of course, the sensitizing dye should be chosen so that it is compatible with the other components of the imaging medium and does not, for example, crystallize out on prolonged storage or undergo slow thermal reactions with other components of the imaging medium during such storage.

The conversion of the sensitizing dye from its first form to its second form may be either a reversible or an irreversible chemical reaction. (In theory, no chemical reaction is thermodynamically completely irreversible; however, as any chemist is aware, there are many reactions where the equilibrium lies so far to one side that no detectable trace of the other supposed components of the equilibrium mixture are present, and the term "irreversible" is used herein to mean such reactions which are for practical purposes irreversible.) For example, conversion of the first form of the sensitizing dye to the second form may be effected by contacting the sensitizing dye with a base; in a preferred variant of the '850 process of this type (hereinafter called the "'850 deprotonation process"), the first form of the sensitizing dye is a protonated form and the second form is a deprotonated form, and the two forms are reversibly interconverted by contact with base or acid. Alternatively, conversion of the first form of the sensitizing dye to the second form may be effected by reacting the sensitizing dye with a nucleophile; this variant of the '850 process is hereinafter called the "'850 nucleophile process". In such a process, the chemical change effected by the nucleophile may be irreversible. Other techniques for converting a first form of the sensitizing dye to its second form may also be used, for example heating the imaging medium to cause thermal decomposition of the sensitizing dye, or bringing about decomposition of the sensitizing dye by exposing the imaging medium to actinic radiation of a wavelength which does not affect the other components of the medium.

Imaging media of the invention (whether of the '850 type or not) still contain, after imaging, a substantial amount of unchanged first acid-generating component, and are thus susceptible to post-imaging color changes caused by unwanted generation of primary acid by ambient radiation striking the first acid-generating component, with consequent generation of primary acid. However, this susceptibility of the imaged media to unwanted color generation can be eliminated by including in the media a "fixing" reagent capable of destroying the first acid-generating component without formation of acid therefrom, thus fixing the image. Fixing reagents capable of fixing media containing superacid precursors, and processes for their use, are described and claimed in copending application Ser. No. 08/232,757, and its continuation-in-part, application Ser. No. 08/430,421, filed Apr. 28, 1994 now U.S. Pat. Nos. 5,741,630 and 5,582,956 respectively) and assigned to the same assignee as the present application. The preferred embodiment of the invention described below with reference to Table 1 and the accompanying drawings contains such a fixing reagent.

In the '850 process, the imagewise exposure is effected with at least part of the sensitizing dye in its first form. The imaging medium may be prepared with at least part of the sensitizing dye already its first form; for example in a deprotonation process, an appropriate amount of acid may be included in a coating solution from which the acid-generating layer is deposited, or this coating solution may be contacted with a separate phase containing an acid. Alternatively, the imaging medium may be prepared with the sensitizing dye in its second or some other precursor form, and converted to its first form within the acid-generating layer before the imagewise exposure is effected; for example, as illustrated below with reference to FIGS. 4A–4D, in a deprotonation process, the imaging medium may be prepared with the sensitizing dye in its deprotonated (second) form and this deprotonated form converted to the protonated (first) form prior to the imagewise exposure by generating or introducing acid into the acid-generating layer. Such acid generation is conveniently effected by exposing the whole of the acid-generating layer to radiation of the second wavelength, with consequent formation of superacid from the superacid precursor, and protonation of at least part of the sensitizing dye. A combination of these two methods of providing acid may of course be used, i.e., one could coat a limited amount of sensitizing dye in its first form and generate additional sensitizing dye in its first form immediately before use.

To illustrate the complex chemical reactions which may take place during an '850 process of the present invention, a preferred process of this type using a secondary acid generator capable of autocatalytic thermal decomposition will now be described, with reference to Table 1 below and FIGS. 4A–4D of the accompanying drawings.

Table 1 and FIGS. 4A–4D of the accompanying drawings show the changes in acid concentration in exposed and non-exposed areas of the acid-generating layer used at various stages during the imaging process. The last section of Table 1, headed "AFTER FIXING," shows the composition of the combined acid-generating and color-change layers after the components thereof have become intermixed.

TABLE 1

| EXPOSED AREA | | NON-EXPOSED AREA | |
|---|---|---|---|
| Component | Moles | Component | Moles |
| [S-DYE] | 1 | [S-DYE] | 1 |
| Secondary acid generator | 50 | Secondary acid generator | 50 |
| $Ph_2I^+SbF_6^-$ | 5 | $Ph_2I^+SbF_6^-$ | 5 |
| AFTER INITIAL ULTRA-VIOLET EXPOSURE | | | |
| $[S\text{-}DYE\text{-}H]^+SbF_6^-$ | 0.75 | $[S\text{-}DYE\text{-}H]^+SbF_6^-$ | 0.75 |
| [S-DYE] | 0.25 | [S-DYE] | 0.25 |
| Secondary acid generator | 50 | Secondary acid generator | 50 |
| $Ph_2I^+SbF_6^-$ | 4.25 | $Ph_2I^+SbF_6^-$ | 4.25 |
| AFTER IMAGEWISE VISIBLE EXPOSURE | | | |
| $[S\text{-}DYE\text{-}H]^+SbF_6^-$ | 0.25 | $[S\text{-}DYE\text{-}H]^+SbF_6^-$ | 0.75 |
| $Ph\text{-}[S\text{-}DYE\text{-}H]^+SbF_6^-$ | 0.75 | [S-DYE] | 0.25 |
| $HSbF_6$ | 0.5 | Secondary acid generator | 50 |
| Secondary acid generator | 50 | $Ph_2I^+SbF_6^-$ | 4.25 |
| $Ph_2I^+SbF_6^-$ | 3.5 | | |
| AFTER HEATING | | | |
| $[S\text{-}DYE\text{-}H]^+SbF_6^-$ | 0.25 | $[S\text{-}DYE\text{-}H]^+SbF_6^-$ | 0.75 |
| $Ph\text{-}[S\text{-}DYE\text{-}H]^+SbF_6^-$ | 0.75 | [S-DYE] | 0.25 |
| $HSbF_6$ | 0.5 | Secondary acid generator | 50 |
| Secondary acid | 50 | $Ph_2I^+SbF_6^-$ | 4.25 |
| $Ph_2I^+SbF_6^-$ | 3.5 | | |
| AFTER FIXING | | | |
| [S-DYE] | 0.25 | [S-DYE] | 1 |
| Ph-[S-DYE] | 0.75 | HOAc | 0.75 |
| HOAc | 6 | KOAc | 1 |
| Image dye/secondary acid salt | 45.5 | Secondary acid generator | 50 |
| Unprotonated image dye | 1 | Cu reagent | 1 |
| Ph-image dye/secondary acid salt | 3.5 | PhOAc | 4.25 |
| | | Unprotonated image dye | 50 |
| Cu reagent | 1 | $KSbF_6$ | 5 |
| $KSbF_6$ | | | |
| K/secondary acid salt | 1 | | |

As shown in Table 1, the imaging medium initially contains the sensitizing dye in its unprotonated form. Both the exposed and non-exposed areas comprise a quantity (shown in Table 1 as 1 mole for simplicity; all references to moles concerning Table 1 refer to moles per unit area of the imaging medium, and are only by way of illustration, since the proportions of the various components may vary widely) of a sensitizing dye, a larger molar quantity of a superacid precursor (5 moles of $Ph_2I^+SbF_6^-$ are shown in Table 1; a suitable quantity of a non-basic polycyclic aromatic sensitizer, such as pyrene, is also included in the medium but is not shown in Table 1) and a still larger molar quantity (50 moles are shown in Table 1) of a secondary acid generator.

The imaging medium is first blanket irradiated with radiation in the second wavelength range, typically near ultra-violet radiation, the amount of radiation applied being sufficient to cause the decomposition of less than one mole (0.75 mole is used for illustration in Table 1 and FIG. 4A) of the superacid precursor, thus producing a corresponding amount of superacid. This superacid immediately protonates the sensitizing dye, producing a salt of the dye shown as "$[S\text{-}DYE\text{-}H]^+SbF_6^-$" in Table 1, and leaving no unbuffered superacid present in the acid-generating layer. Thus, after this initial ultra-violet exposure, as shown in Table 1, all areas of the acid-generating layer contain 0.75 mole of the sensitizing dye salt, 0.25 mole of unprotonated sensitizing dye, 4.25 moles of superacid precursor and 50 moles of secondary acid generator. This situation is illustrated in FIG. 4A, which shows the acid level as 0.75 times a threshold level (indicated by T in FIGS. 4A–4D) at which all the sensitizing dye becomes protonated.

(The secondary reactions that follow the fragmentation of the superacid precursor are not entirely understood at present. However, it is likely that a phenyl radical is generated, which subsequently becomes attached to the radical cation derived from the non-basic polycyclic aromatic sensitizer, following which elimination of a proton occurs. This phenyl radical is ignored in Table 1. Even if some of the phenyl radicals generated do become attached to sensitizing dye molecules, this will not significantly affect the overall course of the process shown in Table 1 and FIG. 1, since a phenylated form of the sensitizing dye would be expected to undergo the same type of protonation and deprotonation reactions, with similar absorption shifts, as the non-phenylated dye.)

After the initial ultra-violet exposure, the imaging medium is imagewise exposed to radiation in the first wavelength range; visible radiation is shown for illustration in Table 1. As shown in Table 1 and FIG. 4B, in the area BC of the acid-generating layer which is exposed to the visible radiation, this visible radiation causes the protonated sensitizing dye to bring about the decomposition of a further 0.75 mole of superacid precursor, with generation of a further 0.75 mole of superacid, so that the total amount of acid present exceeds the threshold T. The additional superacid generated by the visible exposure protonates the remaining 0.25 mole of previously unprotonated sensitizing dye, leaving 0.5 mole of unbuffered superacid in the exposed area BC, as shown in FIG. 4B. (For purposes of illustration, FIG. 4B shows the acid generated in the ultraviolet and visible exposures separately, although of course no difference exists chemically.) In the non-exposed areas AB and CD no change in the acid level occurs, the acid concentration remains below the threshold T, and no unbuffered superacid is present after the visible exposure.

Thus, at the end of the imagewise irradiation, unbuffered superacid is present in the exposed areas, whereas in the non-exposed areas no unbuffered superacid is present, all the superacid generated being buffered by the sensitizing dye. In effect, the acid-generating layer now contains a "latent image" in superacid, although this image is not visible to the human eye.

It is expected that the decomposition of the superacid precursor by the sensitizing dye during the imagewise visible exposure will be accompanied by phenylation of the photooxidized sensitizing dye by the phenyl radical derived from the superacid precursor, followed by elimination of a proton. Accordingly, at the end of the imagewise exposure, the exposed areas will contain 0.75 mole of a phenylated product derived from the protonated sensitizing dye, this product being denoted $Ph\text{-}[S\text{-}DYE\text{-}H]^+SbF_6^-$ in Table 1. The remaining 0.25 mole of sensitizing dye will remain in the $[S\text{-}DYE\text{-}H]+SbF_6^-$ form. Also present in the exposed areas will be 0.5 mole of unbuffered superacid, the 3.5 remaining moles of superacid precursor, and the 50 moles of secondary acid generator, which remain unchanged at this point. (The composition of the non-exposed areas of course remains unchanged by the imagewise visible exposure.)

The imaging medium is next heated. In the exposed area BC, the unbuffered superacid present catalyzes the decomposition of the secondary acid generator, and the secondary acid thus produced also catalyzes the decomposition of additional secondary acid generator, thus producing a large quantity of the secondary acid (50 moles are shown by way of example in Table 1; FIG. 4C is not strictly to scale). However, in the non-exposed areas AB and CD, no unbuffered superacid is present, and the sensitizing dye/superacid salt does not catalyze the decomposition of the secondary acid generator, so that essentially no decomposition of the secondary acid generator occurs and essentially no secondary acid is generated.

In the final step of the process, as discussed in more detail below, the components of the acid-generating and color change layers become intermixed. Table 1 assumes that the color-change layer contains 50 moles of an indicator image dye, 1 mole of copper compound, 1 mole of a reducing agent (the products produced by oxidation of this reducing agent are ignored in Table 1 for simplicity) and 6 moles of a reactive material, shown as potassium acetate in Table 1 (where acetate is abbreviated "OAc"). Table 1 further assumes that the image dye is more basic than the sensitizing dye. In the non-exposed areas, the copper compound, the reducing agent and the reactive material decompose all remaining superacid precursor, with generation of the corresponding amount of phenyl acetate (Table 1 assumes), phenyl iodide (omitted from Table 1) and potassium hexafluoroantimonate. In the exposed areas, the potassium acetate is protonated by the superacid and by some of the secondary acid. The copper reagent catalyzes decomposition of the remaining superacid precursor with the formation of phenyl cations, which react with the most nucleophilic species remaining, here assumed to be the image dye. (In practice, the decomposition of the superacid precursor is probably somewhat more complicated, and other products may be produced; however, the exact type of decomposition products produced does not affect the essential nature of the present process.)

In the exposed areas, the unbuffered superacid and 4.5 moles of the secondary acid are immediately neutralized by the potassium acetate, which also deprotonates the protonated forms of both the original sensitizing dye and the phenylated form of this dye to produce the corresponding unprotonated dyes, thereby removing the absorption in the first wavelength range due to the sensitizing dye. The decomposition of the superacid precursor is catalyzed by the copper compound, leading to the formation of 3.5 moles of phenylated image dye. 45.5 Moles of the secondary acid reversibly protonate and form a salt with the image dye. Both the phenylated and the protonated image dyes are colored. 1 Mole of the image dye remains in its unprotonated, leuco form. FIG. 4D shows graphically the 45.5 moles of secondary acid (3.5 moles of aryl cation are also formed) remaining in the exposed areas.

In the non-exposed areas, the potassium acetate deprotonates the sensitizing dye, returning it to its unprotonated form, and thus reducing the $D_{min}$ of the image in this range (assuming, as is usual, that the absorption change in the image dye is an increase in absorption, i.e., increase in color, in the relevant wavelength range so that the non-exposed areas are the $D_{min}$ areas of the image). The decomposition of the superacid precursor and the deprotonation of the sensitizing dye consumes 5 moles of potassium acetate; 1 mole of potassium acetate remains in the non-exposed areas. This excess of base is represented in FIG. 4D as −1 moles of remaining acid. None of the image dye is protonated, all remaining in its unprotonated, leuco form. The provision of the excess potassium acetate serves to ensure that, if a small amount of uncatalyzed thermal decomposition of the secondary acid generator does occur in non-exposed areas AB and CD during the heating step, the small amount of secondary acid resulting will be neutralized by base before the secondary acid can effect changes in the image dye, as described in more detail below. The excess potassium acetate also ensures that, if minor decomposition of the secondary acid generator does occur after the imaging process has been completed, the minor amounts of acid generated will be neutralized by the potassium acetate and thus will not affect image dye in the non-exposed areas of the final image.

It will be seen from Table 1 that the "neutralization" of the superacid and secondary acid, and deprotonation of the protonated sensitizing dye by the potassium acetate, produce acetic acid. Although acetic acid is normally regarded as an acid, it is insufficiently acidic in the polymeric binders in which the present process is normally carried out to protonate the sensitizing dye or the image dye, and is thus not regarded as an acid for present purposes.

From the foregoing description, it will be seen that, in the exposed areas, the superacid catalyzes the breakdown of the secondary acid generator, and, because the secondary acid generator used in this example produces a secondary acid which can protonate the first site of the secondary acid generator, the resultant secondary acid catalyzes the breakdown of additional secondary acid generator, so that the final quantity of secondary acid present is substantially larger than the quantity of unbuffered superacid produced directly by the imagewise radiation acting on the superacid precursor, although of course the secondary acid is typically a weaker acid than the superacid itself. This "chemical amplification" of the superacid by the autocatalytic secondary acid generator increases the number of moles of acid generated per einstein of radiation absorbed, and thus increases the contrast of the image produced by the present process as compared with simple generation of superacid by a superacid precursor, and as compared with an '850 type process using a non-autocatalytic secondary acid generator. In practice, it has been found that, under proper conditions, at least 20, and in some cases 100 or more, moles of secondary acid can be liberated for each mole of unbuffered superacid present in the exposed areas following the imagewise irradiation.

One advantage of the '489, '612 and '850 processes of the present invention is that it is possible to compensate for any premature breakdown of the superacid precursor which may occur before use of the imaging medium. Such premature breakdown may occur, for example, by exposure of the imaging medium to radiation during transportation and storage or because the mixture of the superacid precursor and the sensitizing dye in the acid-generating layer undergoes slow decomposition on protracted storage.

For example, to take an extreme case purely for purposes of illustration, suppose that the imaging medium shown in Table 1 is exposed to so much ultra-violet radiation during storage and transport that premature breakdown of 0.5 mole of superacid precursor occurs. At the beginning of imaging, all areas of the medium thus contain 0.5 mole of sensitizing dye, 50 moles of secondary acid generator, 4.5 moles of superacid precursor and 0.5 mole of protonated sensitizing dye. After spectral analysis to determine the amount of protonated sensitizing dye already present, the initial ultraviolet exposure may be adjusted so that, in exposed areas, only a further 0.25 mole of superacid precursor is decomposed. After this exposure, the medium will contain 0.75 mole of protonated sensitizing dye, and will thus be in exactly the same condition as the medium used in the first preferred process described above (at the stage represented in FIG. 4A), in which no premature breakdown of the superacid precursor occurred before imaging, but the initial ultra-violet exposure generated 0.75 mole of superacid. Also, provided that no substantial breakdown of first acid-generating component occurs during transportation and storage, an '850 type medium of the present invention which is produced with the sensitizing dye in its unprotonated form is, prior to imaging, essentially insensitive to radiation of the wavelength used for the imagewise exposure, since the unprotonated sensitizing dye, even when exposed to such radiation, does not cause substantial decomposition of the first acid-generating component.

For similar reasons, preferred embodiments of the present process are relatively insensitive to variations in the radiation used for an imagewise exposure, such as variations in laser output, differences between individual lasers in an array used to form the imaging beam, timing errors in laser drivers, etc. For example, in the process shown in Table 1, the imagewise exposure causes decomposition of 0.75 mole of superacid precursor. If the imaging radiation delivered to the imaging medium varies by ±20%, some exposed areas will experience decomposition of 0.6 mole of superacid precursor, while others will experience decomposition of 0.9 mole. Thus, after the imagewise exposure, the concentration of unbuffered superacid in the exposed areas will vary from 0.35 to 0.65 mole. With appropriate control of the heating step, this range of variation in unbuffered superacid concentration will have minimal effects on the final image in cases where the medium is designed to be essentially binary, i.e., any specific pixel is either at $D_{min}$ or at $D_{max}$.

From Table 1 and the related description above, it will be seen that, after an '850 deprotonation medium has been imaged and fixed, in both the exposed and non-exposed areas the sensitizing dye has been returned to its unprotonated form. This is always the case in the non-exposed areas, and is also the case in the exposed areas if the image dye is substantially more basic than the sensitizing dye. If this is not so, in the exposed areas the sensitizing dye will remain protonated (or possibly phenylated) and the absorption in the first wavelength range is a combination of that due to the protonated (or phenylated) image dye and that due to the protonated (or phenylated) sensitizing dye. In such cases, the sensitizing dye should be chosen so that the presence of its protonated (or phenylated) form in the $D_{max}$ areas does not cause objectionable effects on the image. This is especially important in color media having a plurality of different acid-generating layers and color-change layers since if, for example, the protonated (or phenylated) form of the sensitizing dye used in the acid-generating layer associated with the magenta color-change layer has a yellow color, crosstalk will result between the magenta and yellow components of the image. To reduce or eliminate such objectionable effects, it is desirable that the protonated (or phenylated) form of the sensitizing dye have a color similar to that of the colored form of the associated image dye. Sometimes it may be possible to use the same (or a chemically similar) dye as both the sensitizing dye and the image dye.

The potential problem discussed in the preceding paragraph is confined to the '850 deprotonation process. However, a related problem occurs in the '850 nucleophile process of the invention if the nucleophile is more basic than the image dye.

The sensitizing dye used in the '850 deprotonation process may be any molecule, the absorption spectrum of which depends reversibly upon its state of protonation and which can cause decomposition of the superacid precursor used, provided of course that the dye is compatible with the other components of the imaging medium. The state of the sensitizing dye called herein the "unprotonated form" need not necessarily be a neutral molecule; the unprotonated form may be anionic but capable of being protonated to a neutral or cationic form. For example, fluorescein monomethyl ether can exist in a non-aqueous medium in anionic (deprotonated), neutral or cationic (protonated) forms; both the anionic and cationic forms are yellow, while the neutral form is colorless to the eye but absorbs strongly in the mid-ultra-violet region (around 320 nm). The spectral shift of the sensitizing dye upon protonation may be either hypsochromic (to shorter wavelength) or batho-chromic (to longer wavelength). Fluorescein monomethyl ether exhibits both behaviors; the first protonation of the anionic form causes a hypsochromic shift, while the second protonation to the cationic form causes a bathochromic shift.

Preferred indicator sensitizing dyes for use in the '850 deprotonation process include fluoran dyes, phthalide dyes, xanthene dyes, acridine dyes, hydroxy-pyrylium dyes, hydroxythiopyrylium dyes, styrylpyridinium dyes, styrylquinolinium dyes, and other substituted quinolinium, isoquinolinium and pyridinium dyes, with triarylpyridinium, quinolinium and xanthene dyes being especially preferred. Specific triarylpyridinium dyes which have been found useful are protonated forms of:

2,4,6-tris(4-methoxyphenyl)pyridine;
2,6-bis(4-methoxyphenyl)-4-(2-thienyl)pyridine;
2,6-bis(4-methoxyphenyl)-4-(2-(4-bromophenyl) pyridine;
2,6-bis(4-methoxyphenyl)-4-(2-naphthyl)pyridine;
2,4-bis(4-methoxyphenyl)–6-(2-naphthyl)pyridine;
2,4,6-tris(2,4,6-trimethoxyphenyl)pyridine; and
2,6-bis(4-methoxyphenyl)-4-(2-(1,4-dimethoxy) naphthyl)pyridine.

A specific preferred triarylpyridinium dye is the protonated form of 2,4,6-tris-(2,4-dimethoxyphenyl)pyridine.

A specific preferred quinolinium dye is the protonated form of 2-[2-[2,4 bis[octyloxy]phenyl]ethen-1-yl]quinoline (the unprotonated form of this dye is available from Yamada Chemical Co., Kyoto, Japan), while a specific preferred xanthene dye is the protonated form of 3',6'-bis[N-[2-chlorophenyl]-N-methylamino]spiro[2-butyl-1,1-dioxo[1,2-benzisothiazole-3(3H),9'-(9H)xanthene]] (which may be prepared as described in U. S. Pat. No. 4,345,017).

Methods for the preparation of triarylpyridinium dyes are described in the literature. One convenient method for the preparation of such dyes bearing identical substituents at the 2- and 6-positions is described in Weiss, J. Am. Chem. Soc., 74, 200 (1952) and comprises heating a mixture of an acetophenone, an aldehyde (that containing the desired 4-substituent) and ammonium acetate in acetic acid. A dihydropyridine is produced as the penultimate intermediate, but is oxidized to the pyridine by the intermediate chalcone. A second method is similar to the first, but uses hydroxylamine or unsymmetrical dimethylhydrazine in place of ammonium acetate; the penultimate intermediate in these cases are the N-hydroxydihydropyridine or N,N-dimethylaminodihydropyridine, which undergo elimination and aromatization without the need for an oxidizing agent. A third method, described in Krohnke, Synthesis, 1976, 1, can produce asymmetric triarylpyridinium dyes. In this third method, an aryl aldehyde containing the desired 4-substituent and an acetophenone containing the desired 2-substituent are reacted to form an intermediate chalcone, which is then reacted with the phenacylpyridinium salt derived from the acetophenone containing the desired 6-substituent. The resultant pyridinium-substituted dihydropyridine undergoes loss of pyridine with aromatization. All three methods are illustrated in Examples 1–3 of the afore-copending application Ser. No. 08/430,420.

The prior art describes various combinations of nucleophiles and sensitizing dyes which can be used in the '850 nucleophile process; see, for example, U.S. Pat. Nos. 5,258,274 and 5,314,795 (although note that in the '850 nucleophile process the imaging medium may contain the nucleophile itself rather than a nucleophile-generating species as in these patents, since the nucleophile can be kept in a layer or phase separate from the acid-generating layer until the final heating step when the nucleophile converts the sensitizing dye to its second form). The nucleophile used in the present process may be a neutral molecule, for example a primary or secondary amine, a stabilized carbanion, for example a carbanion derived from a malonate ester or a nitroalkane, or a charged nucleophile, for example a thiolate.

The preferred sensitizing dyes for use in the '850 nucleophile process are hemicyanine dyes. Hemicyanine dyes which may be used include those described in the aforementioned U.S. Pat. Nos. 5,258,274 and 5,314,795; preferred hemicyanine dyes are those of the formulae:

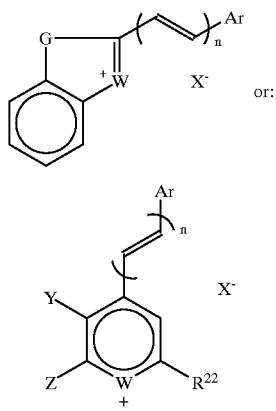

wherein:
G is a $CR^cR^d$ group, a $CR^c=CR^d$ group, an oxygen or sulfur atom, or an $NR^b$ group;
$R^b$ is an alkyl group containing from about 1 to about 20 carbon atoms, or an aryl group;
$R^c$ and $R^d$ are each independently a hydrogen atom, an alkyl group containing from about 1 to about 20 carbon atoms or an aryl group;
n is 1 or 2;
Ar is an aryl or heterocyclyl group;
$X^-$ is an anion;
W is a oxygen, sulfur or selenium atom, or is an $N-R^a$ group, in which $R^a$ is a hydrogen atom, an alkyl group containing from about 1 to about 20 carbon atoms or an aryl group;
Y and Z each represent a hydrogen atom, or together represent the carbon atoms necessary to complete a fused benzene ring;
$R^{22}$ is a hydrogen atom or a substituent in which a non-aromatic carbon atom is bonded directly to the heterocyclic ring, subject to the proviso that if this 2-substituent contains an aromatic nucleus, this aromatic nucleus is not conjugated with the ring. The 2-substituent may be, for example:
a. an alkyl group, for example an isopropyl, sec-butyl, tert-butyl, 2-ethyl-2-methylbutyl or 2,2-dimethylbutyl group;
b. an alkenyl group, for example a vinyl group;
c. an alkynyl group, for example an ethine group;
d. a cycloalkyl group, for example a cyclohexyl group;
e. a cycloalkenyl group, for example a cyclohexenyl group;
f. a polycyclic saturated hydrocarbon group, for example a decalinyl or adamantyl group;
g. a polycyclic, ethylenically unsaturated hydrocarbon group, for example a 6,6-dimethylbicyclo[3.1.1]hept-2-en-2-yl or bicyclo[2.2.1]hept-2-en-5-yl group;
h. any of the foregoing substituents substituted with aryl, halo, cyano, amino or oxo groups, or containing ether, amine or urethane linkages.

The anion X of the dye should be chosen with care having regard to the superacid which will be generated during the imaging process. For example, it is inadvisable to use iodide, or another anion derived from a weak acid, as the anion of the dye, since the presence of such an anion in the acid-generating layer during imaging will cause the superacid generated to protonate the anion, thus leading to the formation of HI, or an acid which is similarly weak in a polymeric medium of low dielectric constant (such as those typically used in the imaging media of the present invention), which cannot effectively protonate the secondary acid generator, and thus does not initiate the acid amplification process. Conveniently, the anion X is chosen to be the same as that of the superacid precursor; thus, for example, when the preferred superacid precursor diphenyliodonium hexafluoroantimonate is used, the anion X is conveniently hexafluoroantimonate. Specific preferred hemicyanine sensitizing dyes which have been found useful in the '850 nucleophile process include:
1-methyl-2-[2-[2,4-bis[octyloxy]phenyl]ethen-1-yl]quinolinium hexafluoroantimonate;
1-methyl-2-[2-[4-diphenylaminophenyl]ethen-1-yl]quinolinium hexafluoroantimonate;
3,3-dimethyl-1-methyl-2-[2-[9-phenylcarbazol-3-yl]ethen-1-yl]-3H-indolium hexafluoroantimonate;
3,3-dimethyl-1-methyl-2-[2-[9-ethylcarbazol-3-yl]ethen-1-yl]-3H-indolium hexafluoroantimonate; and
2-(1,1-dimethylethyl)-6-(1-methylpropoxy)-4-[2-[9-phenylcarbazol-3-yl]ethen-1-yl]benz[b]pyrylium hexafluoroantimonate.

In the '850 process, it is desirable that the layer or phase containing the sensitizing dye also comprise a cosensitizer. This cosensitizer is an electron-donor which reacts with a combination of the excited state of the sensitizing dye and the superacid precursor so as to return the dye to its ground state and transfer an electron to the superacid precursor, thereby bringing about decomposition of the superacid precursor with formation of superacid. The presence of a cosensitizer capable of acting in this manner greatly improves the quantum efficiency of the reaction between the photoexcited sensitizing dye and the superacid precursor (i.e., the quantum efficiency of superacid generation and thus the sensitivity of the imaging medium). The cosensitizer must have an oxidation potential capable of reducing the excited state of the dye, but not so low that it reacts thermally with the superacid precursor; in practice, the cosensitizer should have an oxidation potential of about 700 to about 1000 mV relative to a saturated calomel electrode. Desirably, following the electron transfer to the superacid precursor, the cosensitizer should decompose quickly to prevent reverse electron transfer from the superacid precursor. The rate of decomposition of any proposed cosensitizer can be estimated by cyclic voltammetry; desirably, this rate of decomposition should be such that no reversible potential can be measured at a scanning rate below about 1 V sec$^{-1}$. Finally, the cosensitizer must not be more basic than the secondary acid generator, so that it does not interfere with the superacid-catalyzed thermal decomposition of the secondary acid generator.

Preferred cosensitizers include triarylamines (for example, triphenylamine) and hydroquinones. Preferred triarylamine cosensitizers are triphenylamines in which at least one of the phenyl rings bears a para hydroxyalkyl, alkoxyalkyl or α-alkenyl group, and those in which at least one of the phenyl rings bears a meta substituent selected from the group consisting of alkoxy, aryloxy, arylamino, alkyl and aryl groups. In the latter case, the ring bearing the meta substituent should either have no para substituent, or should have a para hydroxyalkyl, alkoxyalkyl or α-alkenyl substituent.

Since preferred embodiments of the present process (such as the '489, '612 and '850 types) rely upon the production of unbuffered superacid, it is highly desirable that such processes be conducted under essentially anhydrous conditions; as chemists are well aware, the most powerful acidic species that can exist in the presence of more than one equivalent of water is the hydroxonium (hydronium) ion, $[H_3O]^+$. Accordingly, if the medium in which such processes are conducted contains water, at least part of the superacid produced by the present process will simply generate hydroxonium ion. However, in the absence of water, the superacid yields an acidic species much stronger than hydroxonium ion, and this acidic species can effect the acid-catalyzed decomposition of various secondary acid generators which hydroxonium ion cannot. Typically, such processes are carried out with the superacid precursor and the sensitizing dye dispersed in a polymeric binder, and such binders can readily be chosen to provide an essentially anhydrous environment for the process.

In its most general form, the '850 process requires only that, following the formation of the imagewise distribution of the secondary acid, the sensitizing dye be converted to its second form in at least the non-exposed areas of the medium. Although, at least in theory, the appropriate reagent for effecting this conversion could be supplied from an external source (for example, by spraying a solution of the reagent on to the exposed medium), for practical reasons it is normally desirable to have the reagent present in the imaging medium prior to exposure, so that the imaging medium provides a self-contained imaging system not requiring the use of liquid reagents. Usually, it is convenient to have the reagent capable of converting the first form of the sensitizing dye to its second form present in the color-change layer or phase of the imaging medium, so that the mixing of the components of the acid-generating and color-change layers or phases introduces the reagent into the non-exposed areas of the medium, thus converting the sensitizing dye to its second form. However, there are certain applications of the '850 process where it may be desirable to include the reagent in a layer of the imaging medium other than the color-change layer. In particular, for practical reasons, it is generally convenient to prepare '850 type imaging media by first depositing an acid-generating layer from a non-aqueous medium on to a support, and then to deposit a color-change layer from an aqueous medium on to the acid-generating layer. If this process is used to prepare a "dupe" film for use in the graphic arts industry, it is necessary that the medium be exposed from the color-change layer side, since exposing through the relatively thick support may lead to a loss in resolution. However, exposing through the color-change layer may require that the image dye (which in a write-white medium such as dupe film must be colored in base and essentially colorless in acid) be present in its colorless form during the exposure, since otherwise it may absorb the radiation intended for exposure of the underlying acid-generating layer. To ensure that the image dye is coated in a form which does not prevent imaging by absorbing the imaging radiation, a medium of this type conveniently comprises:

(a) a color-change layer comprising an image dye which has substantial absorption (i.e., is "colored," where the "color" in question will typically be in the near ultraviolet) in base but has low absorption in acid, the image dye being present in its protonated (colorless) form;

(b) an acid-generating layer; and (c) a layer containing a conversion reagent (typically a base) interposed between the acid-generating layer and the color-change layer, the quantity of the conversion reagent being sufficient to cause coloration of all the image dye in non-exposed regions of the medium after heating, plus any additional amount necessary for fixation.

In principle, in the '612 and '850 processes, the mixing of the components of the acid-generating and color-change layers should be effected after the generation of the secondary acid from the secondary acid generator. However, in practice both the generation of the secondary acid in the acid-generating layer and the mixing of the components of the two layers may be effected in a single heating step, since the superacid-catalyzed thermal decomposition of the secondary acid generator will typically be essentially complete before mixing of the two layers becomes significant.

Obviously, it is important that the components of the acid-generating layer and the color-change layer not mix prematurely. In practice, as already noted, the imaging medium will typically be formed by coating both layers from a solution or dispersion on to a support. To prevent premature mixing, it. is usually desirable to coat one layer from an aqueous medium and the other from a non-aqueous medium. Typically, the acid-generating layer is coated from an organic medium and the color-change layer from an aqueous medium.

The image dye used in the '850 process may be any material that undergoes a color change in the presence of the secondary acid. Thus any conventional indicator dye may be used as the acid-sensitive material, as may the leuco dyes disclosed in U.S. Pat. Nos. 4,602,263; 4,720,449 and 4,826,976, which are also sensitive to acid.

As will be apparent to those skilled in the imaging art, an '850 medium which contains a plurality of color-change layers (for example, a full color medium containing three or four color-change layers) need not use the '850 process in all of the color-change layers; one or more of the color-change layers can use the '850 process, while the other color-change layer(s) use other color-forming mechanisms, for example the '612 process or conventional sensitization of superacid precursors with non-basic polycyclic aromatic sensitizers. For example, the specific preferred embodiment of the invention described below with reference to FIG. 5 uses two acid-generating and two color-change layers using the '850 process, and one acid-generating and color-change layer using a conventional non-basic polycyclic aromatic sensitizer.

It should be noted that the '850 process may allow the use of combinations of superacid precursor and indicator sensitizing dye in which the combination of the precursor and the absorbing (i.e., first) form of the sensitizing dye is unstable on long term storage. Provided that the combination of the precursor and the non-absorbing (i.e., second) form of the sensitizing dye is stable on long term storage, the relevant acid-generating layer can be prepared with the dye in its second (or other precursor) form, and the first form of the dye produced immediately before the imagewise exposure; in a deprotonation process, the conversion of the second form of the sensitizing dye to its first form is conveniently accomplished by exposing the imaging medium to actinic radiation effective to generate superacid within the acid-generating layer, as described above with reference to Table 1. After the imagewise exposure, the conversion of the sensitizing dye to its second form in accordance with the present invention and/or fixing effected by destruction of the remaining superacid precursor will ensure that the unstable combination of the superacid precursor and the first form of the sensitizing dye is not present after imaging.

Preferred uses of the '850 process include:

(a) the use of visible imagewise exposure to produce a visible image, which may be positive or negative;

(b) a true- or false-sensitized full color image exposed at three different wavelengths (for example, a print paper)

(c) the use of near infra-red (700–1200 nm) radiation to produce a visible image having good $D_{min}$ when viewed in reflection (in this process, the first form of the sensitizing dye has a near infra-red absorption peak and the second form of the dye has a substantially lower visible absorption than the first form);

(d) the use of ultra-violet exposure to form an ultra-violet photomask; and (e) the formation of a full color image using a single source (preferably a laser) at a single visible or near infra-red wavelength to effect imagewise exposure of all three acid-generating layers of the medium.

Process (e) above conveniently uses an '850 deprotonation process with an imaging medium having three associated pairs of acid-generating layers and color-change layers (each pair comprising an acid-generating layer and a color-change layer may hereinafter be called a "bilayer"), with each adjacent pair of bilayers being separated by an acid-impermeable interlayer. This type of imaging medium comprises:

a first acid-generating layer comprising a sensitizing dye in its protonated form, optionally a cosensitizer, a superacid precursor and a secondary acid generator;

a first color-change layer disposed adjacent the first acid-generating layer and comprising a reactive material capable of irreversibly destroying the superacid precursor present in the first acid-generating layer, and a first image dye undergoing a change in its absorption of radiation upon contact with the secondary acid generated upon acid-catalyzed decomposition of the secondary acid generator in the first acid-generating layer;

a first acid-resistant interlayer superposed on the first acid-generating layer and the first color-change layer;

a second acid-generating layer disposed on the opposed side of the first acid-resistant interlayer from the first acid-generating layer and the first color-change layer, the second acid-generating layer comprising a sensitizing dye in its unprotonated form, optionally a cosensitizer, a superacid precursor and a secondary acid generator, the second acid-generating layer further comprising a first auxiliary sensitizer which renders the superacid precursor therein susceptible to decomposition by actinic radiation of a first wavelength in the second wavelength range, but not susceptible to decomposition by actinic radiation of a second wavelength in the second wavelength range;

a second color-change layer disposed adjacent the second acid-generating layer and on the opposed side of the first acid-resistant interlayer from the first acid-generating layer and the first color-change layer, the second color-change layer comprising a reactive material capable of irreversibly destroying the superacid precursor present in the second acid-generating layer, and a second image dye undergoing a change in its absorption of radiation upon contact with the secondary acid generated upon acid-catalyzed decomposition of the secondary acid generator in the second acid-generating layer, the absorption change undergone by the second image dye being different from that undergone by the first image dye;

a second acid-resistant interlayer disposed on the opposed side of the second acid-generating layer and second color-change layer from the first acid- resistant interlayer;

a third acid-generating layer disposed on the opposed side of the second acid-resistant interlayer from the second acid-generating layer and second color-change layer, the third acid-generating layer comprising a sensitizing dye in its unprotonated form, optionally a cosensitizer, a superacid precursor and a secondary acid generator, the third acid-generating layer further comprising a second auxiliary sensitizer which renders the superacid precursor therein susceptible to decomposition by actinic radiation of the second wavelength in the second wavelength range, but not susceptible to decomposition by actinic radiation of the first wavelength in the second wavelength range; and a third color-change layer disposed adjacent the third acid-generating layer and on the opposed side of the second acid-resistant interlayer from the second acid-generating layer and the second color-change layer, the third color-change layer comprising a reactive material capable of irreversibly destroying the superacid precursor present in the third acid-generating layer, and a third image dye undergoing a change in its absorption of radiation upon contact with the secondary acid generated upon acid-catalyzed decomposition of the secondary acid generator in the third acid-generating layer, the absorption change undergone by the third image dye being different from those undergone by the first and second image dyes.

Very conveniently, in this preferred form of imaging medium, the same sensitizing dye, superacid precursor and secondary acid generator are present in each of the three acid-generating layers. If the image is to be fixed, the same fixing reagent is also preferably used in each of the three color-forming layers.

This type of imaging medium is imaged in the following manner. First, the medium is imagewise exposed, from the surface closer to the third acid-generating layer, to actinic radiation in the first wavelength range, thereby causing, in the exposed areas of the first acid-generating layer or phase, the sensitizing dye to decompose at least part of the superacid precursor, with formation of unbuffered superacid in the first acid-generating layer, without substantial production of unbuffered superacid in the second and third acid-generating layers. Thereafter, the whole imaging medium is exposed to radiation of the first wavelength in the second wavelength range, thus decomposing part of the superacid precursor in the second acid-generating layer to produce superacid and converting at least part of the sensitizing dye in the second acid-generating layer to its protonated form, without substantial production of superacid in the third acid-generating layer. The medium is then imagewise exposed to actinic radiation in the first wavelength range, thus causing, in the exposed areas of the second acid-generating layer or phase, the sensitizing dye to decompose at least part of the superacid precursor, with formation of unbuffered superacid in the second acid-generating layer, without substantial production of unbuffered superacid in the first and third acid-generating layers. Thereafter, the whole imaging medium is exposed to radiation of the second wavelength in the second wavelength range, thus decomposing part of the superacid precursor in the third acid-generating layer to produce superacid and converting at least part of the sensitizing dye in the third acid-generating layer to its protonated form. The medium is then imagewise exposed to actinic radiation in the first wavelength range, thus causing, in the exposed areas of the third acid-generating layer or phase, the sensitizing dye to decompose at least part of the superacid precursor, with formation of unbuffered superacid in the third acid-generating layer, without substantial production of unbuffered superacid in the first and second acid-generating layers. The last two stages of the imaging process are heating the medium to cause, in the exposed areas of the first, second and third acid-generating layers, acid-catalyzed thermal decomposition of the secondary acid generator and formation of the secondary acid, and admixing the components of the first acid-generating layer with those of the first color-change layer, the components of the second acid-generating layer with those of the second color-change layer, and the components of the third acid-generating layer with those of the third color-change layer, thus causing, in the areas of the medium exposed to the three imagewise exposures, the secondary acids to bring about the changes in absorption of the first, second and third image dyes and thus form a trichrome image, and the reactive material to destroy the remaining superacid precursor in each of the three acid-generating layers, thus fixing the image. If the same sensitizing dye is used in each of the three acid-generating layers, all three imagewise exposures can be effected using radiation of the same wavelength (for example, a single laser) thus avoiding, for example, the need for three separate sources of imaging radiation, all of which must be scanned across the imaging medium.

As already mentioned preferred imaging media of the present invention typically comprise acid-generating and color-change layers or phases. Such media may also comprise a support and additional layers, for example, a subbing layer to improve adhesion to the support, acid-impermeable interlayers (as discussed above) for separating multiple bilayers from one another, an anti-abrasive topcoat layer, and other auxiliary layers.

The support employed may be transparent or opaque and may be any material that retains its dimensional stability at the temperature used for image formation. Suitable supports include paper, paper coated with a resin or pigment, such as, calcium carbonate or calcined clay, synthetic papers or plastic films, such as polyethylene, polypropylene, polycarbonate, cellulose acetate and polystyrene. The preferred material for the support is a polyester, desirably poly(ethylene terephthalate).

Usually the acid-generating and color-change layers or phases will each also contain a binder; typically these layers are formed by combining the active materials and the binder in a common solvent, applying a layer of the coating composition to the support and then drying. Rather than a solution coating, the layer may be applied as a dispersion or an emulsion. The coating composition also may contain dispersing agents, plasticizers, defoaming agents, coating aids and materials such as waxes to prevent sticking.

The binder used for an acid-generating layer must of course be sufficiently non-basic that the first acid generated during the present process is not buffered by the binder.

Examples of binders that may be used include styrene-acrylonitrile copolymers, polystyrene, poly(a-methylstyrene), copolymers of styrene and butadiene, poly(methyl methacrylate), copolymers of methyl and ethyl acrylate, poly(vinyl butyral), polycarbonate, poly(vinylidene chloride) and poly(vinyl chloride). It will be appreciated that the binder selected should not have any adverse effect on the first acid-generating component, sensitizing dye (if any), secondary acid generator, fixing reagent (if any) or image dye (if any) incorporated therein. Also, the binder should be heat-stable at the temperatures encountered during the heating step and should be transparent so that it does not interfere with viewing of the image. The binder must of course transmit the actinic radiation used in the exposure step(s).

The imaging media of the present invention may be used in any of the ways in which the aforementioned '489, '612 and '850 media have been used. Specifically, the imaging media of the present invention may be suitable for use in slide blanks similar to those described in U.S. Pat. Nos. 5,422,230 and 5,451,478 and the corresponding International Applications Nos. PCT/US95/04401 and PCT/US95/04395 respectively (Publication Nos. WO 95/27623 and WO 95/27622 respectively), to which patents and applications the reader is referred for further details.

A preferred embodiment of the invention will now be described, though by way of illustration only, with reference to FIG. 5 of the accompanying drawings, which shows a schematic cross-section through a full color '850 deprotonation type imaging medium (generally designated 10) of the present invention as the image therein is being fixed by being passed between a pair of hot rollers 12.

The imaging medium 10 comprises a support 14 formed from a plastic film. Typically the support 14 will comprise a polyethylene terephthalate film 3 to 10 mils (76 to 254 m$\mu$) in thickness, and its upper surface (in FIG. 5) may be treated with a sub-coat, such as are well-known to those skilled in the preparation of imaging media, to improve adhesion of the other layers to the support.

On the support 14 is disposed a first acid-generating layer 16 comprising:
(a) a superacid precursor, namely [4-[2-hydroxytetradecan-1-yloxy]phenyl]phenyliodonium hexafluoroantimonate;
(b) a nucleophilically-bleachable sensitizing dye of the formula:

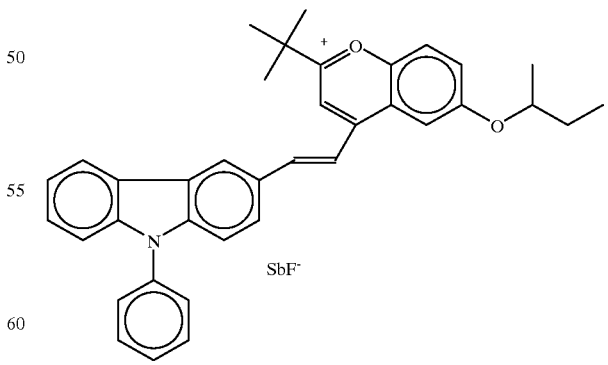

This sensitizing dye sensitizes the superacid precursor to red visible radiation;
(c) a secondary acid generator, which undergoes thermal decomposition to form a secondary acid, this thermal decomposition being catalyzed by the hexafluoroantimonate superacid generated from the superacid precursor and the secondary, acid (namely a diphenylphosphoric acid) generated from the secondary acid generator; this secondary acid generator is of the formula:

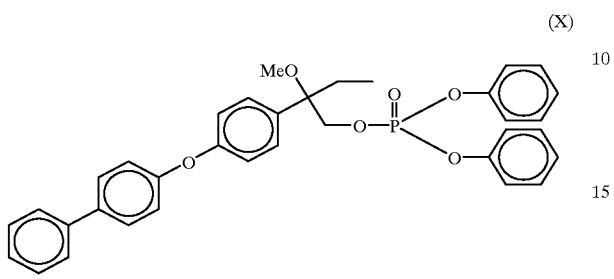

(X)

(d) a cosensitizer, namely tris(m-methylphenyl)amine; and (e) a polystyrene binder.

On the opposed side of the acid-generating layer 16 from the support 14 is disposed a first color-change layer 18 comprising:

(a) a first image dye, of the formula:

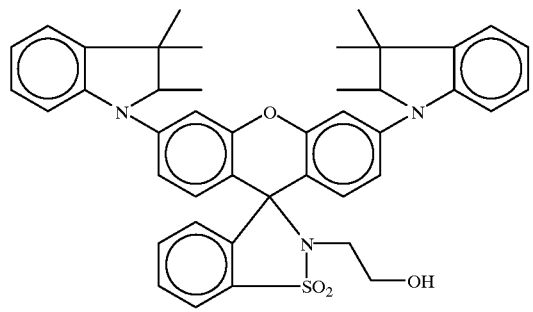

which changes from colorless to cyan in the presence of an acid;

(b) a phenolic nucleophile, namely 1,3-dihydroxy-4-dodecyl-benzene (c) copper(II) benzoylacetoacetate;

(d) an amine, namely N,N'-bis(3-aminopropyl)piperazine; and (e) a binder, namely poly(2-hydroxypropyl methacrylate).

The binders used in the acid-generating layer 16 and the color-change layer 18 both have a glass transition temperature substantially above room temperature.

Superposed on the first color-change layer 18 is an acid-impermeable layer 20, which serves to prevent acid generated in the second acid-generating layer 22 (see below) during imaging penetrating to the first color-change layer 18. Superposed on the acid-impermeable layer 20 is a second acid-generating layer 22, which contains the same superacid precursor, secondary acid generator and binder as the first acid-generating layer 16. However, the second acid-generating layer 22 contains, as a nucleophilically-bleachable sensitizing dye:

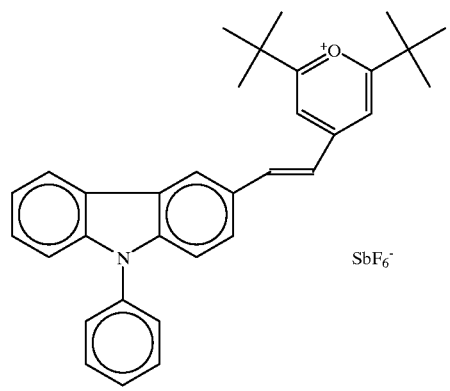

which sensitizes the superacid precursor to green visible radiation.

Superposed on the second acid-generating layer 22 is a second color-change layer 24 which is identical to the first color-change layer, except that the image dye previously described is replaced by a second image dye, of the formula:

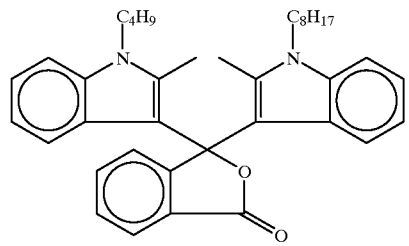

(available from Hilton Davis Co., 2235 Langdon Farm Road, Cincinnati, Ohio 45237 under the tradename "Copikem 35"), which changes from colorless to magenta in the presence of an acid.

The next layer of the imaging medium is a second acid-impermeable interlayer 26, identical to the layer 20. Superposed on the acid-impermeable layer 26 is a third acid-generating layer 28, which contains the same superacid precursor, secondary acid generator and binder as the first and second acid-generating layers 16 and 22 respectively. However, this third acid-generating layer 28 contains an indicator sensitizing dye of the formula:

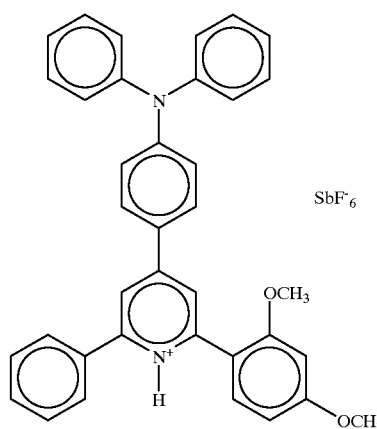

which sensitizes the superacid precursor to blue visible radiation. Superposed on the third acid-generating layer 28 is a third color-change layer 30 which is identical to the first color-change layer, except that the image dye is the free base form of the sensitizing dye used in the third acid-generating layer; this image dye changes from colorless to yellow in the presence of an acid. Finally, the imaging medium 10 comprises an abrasion-resistant topcoat 32.

The imaging medium 10 is exposed by writing on selected areas of the medium with three radiation sources having wavelengths in the red, green and blue visible regions respectively. The three radiation sources may be applied simultaneously or sequentially; for example, the medium may be scanned in a raster pattern in any known manner for example (a) simultaneously by the focused beams from three lasers of appropriate wavelengths; (b) sequentially through three masks to radiation from lamps generating radiation of appropriate wavelengths; or (c) simultaneously through a three-color mask to appropriately-filtered radiation from a lamp (thus, this medium is useful for making photographic prints from negatives). The red radiation, which carries the cyan channel of the desired image, images the first acid-generating layer 16, the green radiation, which carries the magenta channel, images the second acid-generating layer 22 and the blue radiation, which carries the yellow channel, images the third acid-generating layer 28. Thus, as described above with reference to FIGS. 4A–4D, since the sensitizing dyes in the three acid-generating layers 16, 22 and 28 are present in their first (i.e., strongly absorbing) form, latent images in unbuffered superacid are formed in the acid-generating layers 16, 22 and 28.

The imaging medium 10 is passed between the heated rollers 12; the heat applied by these rollers causes the unbuffered superacid present in the exposed areas of the acid-generating layers 16, 22 and 28 to cause catalytic breakdown of the secondary acid generator therein, thus causing formation of a quantity of secondary acid substantially greater than the quantity of unbuffered superacid generated by the imagewise exposures. The secondary acid thus produced also catalyzes the thermal decomposition of further secondary acid generator, thus further increasing the amount of secondary acid present. The heat and pressure applied by the heated rollers 12 also raise the acid-generating layers 16, 22 and 28 and the color-change layers 18, 24 and 30 above their glass transition temperatures, thus causing the components present in each acid-generating layer to intermix with the components present in its associated color-change layer. Accordingly, the three associated pairs of acid-generating and color-change layers are "developed" and fixed as described above with reference to Table 1; i.e., the copper compound decomposes the remaining superacid precursor and the base neutralizes the unbuffered superacid present. In the exposed areas, the secondary acid produced in the acid-generating layer effects the color change of the image dye in the associated color-change layer, thereby forming cyan, magenta and yellow images in the layers 18, 24 and 30 respectively. In the non-exposed areas, excess base remains and the image dye remains uncolored. The acid-impermeable interlayers 20 and 26 prevent the unbuffered superacid or the secondary acid generated in the second and third acid-generating layers 22 and 28 respectively migrating to the first and second color-change layers 18 and 24 respectively, thus preventing crosstalk among the three images. The mixing of the components present in each bilayer also causes the base present in each of the color-change layers to deprotonate and/or nucleophilically attack the original forms of the sensitizing dyes present in the non-exposed areas of its associated acid-generating layer, thus removing the visible absorption due to the first forms of the sensitizing dyes, and reducing the $D_{min}$ of the images to a low level.

The following Examples are now given, though by way of illustration only, to show details of preferred reagents, conditions and techniques for use in the process and medium of the present invention.

EXAMPLE 1

Preparation of [2R*,7S*]-2-hydroxy-2-(4-methylphenyl)bicyclo[2.2.1]heptan-7-yl p-toluenesulfonate This Example illustrates the preparation of the secondary acid generator of Formula IX in which $L^1$ is a hydroxyl group $L^2$ is a (4-methylphenyl)-sulfonyl group and $R^{19}$ is a 4-methylphenyl group. The starting material used is anti-7-norbornenol (7-hydroxybicyclo[2.2.1]hept-2-ene); this starting material may be prepared by the process described in Story, J. Org. Chem., 26, 287 (1961).

Part A

Preparation of bicyclo[2.2.1]hept-2-en-anti-7-yl benzoate

A 500 mL, three-necked, round-bottomed flask, equipped with a magnetic stirrer and nitrogen gas inlet, was charged with dry pyridine (150 mL), anti-7-norbornenol (10.0 g, 0.091 mole) and benzoyl chloride (19.1 g, 0.136 mole). The resultant reaction mixture was stirred overnight under nitrogen at ambient temperature. Saturated sodium bicarbonate solution (500 mL) was then added, and the resultant mixture extracted twice with 300 mL aliquots of diethyl ether. The ether extracts were combined, washed with distilled water and dried over anhydrous sodium sulfate, then the ether was removed on a rotary evaporator. The pale yellow solid residue thus produced was recrystallized from methanol to give the desired product as a white crystalline solid, melting point 46–47° C., yield 16.5 g, 84% based upon the norbornenol starting material. The product was characterized as follows: Proton Nuclear Magnetic Resonance (NMR) (in deuterochloroform): δ1.07 (2H, multiplet), 1.83 (2H, multiplet), 2.83 (2H, singlet), 4.53 (1H, singlet), 6.01 (2H, doublet), 7.37 (2H, multiplet), 7.48 (1H, doublet) and 7.94 (2H, doublet)

Carbon-13 NMR (in deuterochloroform): δ21.92, 43.64, 82.87, 128.37, 129.50, 130.50, 132.93, 134.00 and 165.95

FAB Mass spectrum M+Na$^+$: 237

Part B

Preparation of 2-oxobicyclo[2.2.1]heptan-anti-7-yl benzoate

This compound corresponds to Formula IX with $L^2$ being a benzoyloxy group and $L^1$ and $R^{19}$ together forming an oxo group.

A 3 L, three-necked, round-bottomed flask, equipped with a mechanical stirrer, a thermometer, a condenser and a nitrogen gas inlet, was dried in an oven, assembled while still hot and cooled while passing nitrogen therethrough. The flask was then charged with bicyclo[2.2.1]hept-2-en-anti-7-yl benzoate (30 g, 0.14 mole, prepared as in Part A above), and anhydrous diethyl ether (500 mL) and the resultant ether solution, maintained under a nitrogen atmosphere, was cooled to 0–2° C. with an ice water bath, and the thermometer was replaced by a rubber septum. Borane-tetrahydrofuran (THF) complex (280 mL of 1.0 M solution in THF, 0.28 mole) was added through the rubber septum using a syringe over a period of 20 minutes. The resultant reaction mixture was stirred for 90 minutes at 0–2° C. under a nitrogen atmosphere and then ice water (250 mL) was added cautiously to decompose excess borane. Water was added to the flask and then the reaction mixture was extracted twice with 250 mL aliquots of diethyl ether. The ether extracts were combined and dried over anhydrous sodium sulfate, then the ether was removed on a rotary evaporator. To remove trace amounts of water azeotropically from the residue thus produced, toluene was added to the residue and then removed under reduced pressure.

The resulting solid white residue was dried in a vacuum desiccator over phosphorus pentoxide for two hours and then dissolved in dry dichloromethane (1.5 L) in a 3 L, three-necked, round-bottomed flask, equipped with a mechanical stirrer, a thermometer and a condenser with a nitrogen gas inlet, which had been dried in an oven, assembled while still hot and cooled while passing nitrogen therethrough. Pyridinium chlorochromate (189 g, 0.88 mole) was added to the flask and the resultant reaction mixture stirred under a nitrogen atmosphere for 3 hours under reflux, then cooled and saturated brine (300 mL) was added and the resultant mixture extracted once with dichloromethane (300 mL). The dichloromethane phase was separated from the aqueous phase, and the dichloromethane solvent removed on a rotary evaporator to give a dark brown residue, which was purified by flash column chromatography on silica gel using a 1:1 v/v diethyl ether/hexane mixture as eluant, to give the desired product as a white crystalline solid, melting point 66–68° C., yield 25.3 g, 79% based upon the benzoate starting material. The product was characterized as follows:

Proton NMR (in deuterochloroform): δ1.49–1.61 (2H, multiplet), 2.03–2.23 (4H, multiplet), 2.80 (2H, doublet), 5.15 (1H, singlet), 7.41 (2H, multiplet), 7.52 (1H, doublet) and 7.95 (2H, doublet)

Carbon-13 NMR (in deuterochloroform): δ21.66, 25.01, 38.62, 40.11, 53.21, 78.02, 128.52, 129.60, 129.75, 133.36, 165.73 and 212.39

FAB Mass spectrum M +1: 231

Part C

Preparation of [2R*,7S*]2-(4-methylphenyl)bicyclo[2.2.1]heptane-2,7-diol

This compound corresponds to Formula IX with $L^1$ and $L^2$ each being a hydroxyl group and $R^{19}$ being a 4-methylphenyl group.

A 100 mL, three-necked, round-bottomed flask, equipped with a mechanical stirrer, a condenser and a nitrogen gas inlet, was dried in an oven, assembled while still hot and cooled while passing nitrogen therethrough. The flask was then charged with anhydrous diethyl ether (15 mL) and 2-oxobicyclo[2.2.1]heptan-anti-7-yl benzoate (2.0 g, 8.7 mmole, prepared as in Part B above). To the resultant ether solution, p-tolylmagnesium bromide (39 mL of a 1.0 M solution in diethyl ether, 39 mmole) was added over a period of 15 minutes, with stirring, using a syringe inserted through a rubber septum, then the resultant mixture was stirred for 2 hours under a nitrogen atmosphere at ambient temperature. Saturated brine (15 mL) was then added cautiously, and the resultant mixture extracted twice with 20 mL aliquots of diethyl ether. The ether extracts were combined, washed with distilled water and dried over anhydrous sodium sulfate, then the ether was removed on a rotary evaporator. The pale yellow solid residue thus produced was purified by flash column chromatography on silica gel using a 1:1 v/v diethyl ether/hexane mixture as eluant, to give the desired product as a white crystalline solid, melting point 130–131° C., yield 1.8 g, 95% based upon the norcamphor starting material. The product was characterized as follows:

Proton NMR (in deuterochloroform): δ1.48–1.52 (4H, multiplet), 1.80–1.84 (2H, multiplet), 2.07–2.20 (3H, multiplet), 2.28 (3H, singlet), 2.51 (1H, singlet), 4.02 (1H, singlet), 7.10 (2H, doublet) and 7.34 (2H, doublet)

Carbon-13 NMR (in deuterodimethyl sulfoxide): δ18.96, 20.50, 26.09, 41.29, 43.89, 52.04, 75.67, 76.40, 125.76, 128.25, 134.93 and 147.35

FAB Mass spectrum M+Na$^+$: 241.

Part D

Preparation of [2R*,7S*]2-hydroxy-2-(4-methylphenyl)bicyclo[2.2.1]heptan-7-yl p-toluenesulfonate A 50 mL round-bottomed flask, equipped with a drying tube, was charged with dry pyridine (5 mL), [2R*,7S*]-2-(4-methylphenyl)bicyclo[2.2.1]heptane-2,7-diol (0.8 g, 3.7 mmole, prepared as in Part C above) and p-toluenesulfonyl chloride (0.74 g, 3.88 mmole), and the resultant reaction mixture allowed to stand for 36 hours at ambient temperature. Saturated sodium bicarbonate solution (25 mL) was then added, and the resultant mixture extracted twice with 25 mL aliquots of diethyl ether. The ether extracts were combined, washed with distilled water and dried over anhydrous sodium sulfate, then the ether was removed on a rotary evaporator. The pale yellow solid residue thus produced was purified by flash column chromatography on silica gel using a 1:1 v/v diethyl ether/hexane mixture as eluant, then recrystallized from diethyl ether/pentane to give the desired product as a white crystalline solid, yield 1.0 g, 74% based upon the diol starting material. This product decomposed at 68° C. before melting. The product was characterized as follows:

Proton NMR (in deuterochloroform): δ1.48–1.55 (2H, multiplet), 1.72–1.76 (2H, multiplet), 2.04–2.16 (4H, multiplet), 2.29 (3H, singlet), 2.39 (3H, singlet), 2.61 (1H, singlet), 4.48 (1H, singlet), 7.07 (2H, doublet), 7.19 (2H, doublet), 7.22 (2H, doublet) and 7.70 (2H, doublet)

Carbon-13 NMR (in deuterochloroform): δ18.80, 20.92, 21.02, 26.06, 40.72, 43.98, 49.43, 75.90, 85.91, 125.31, 127.76, 129.15, 129.55, 129.90, 133.72, 136.88 and 144.86

FAB Mass spectrum M+Na$^+$: 395.

EXAMPLE 2

Preparation of [1S,2S,3R,5S]-2-hydroxy-2,6,6-trimethylbicyclo[3.1.1]heptan-3-yl p-toluenesulfonate This Example illustrates the preparation of the secondary acid generator of Formula V in which $R^{11}$ is a methyl group, $L^1$ is a hydroxyl group, $L^2$ is a p-methylphenylsulfonyl group, m is 1 and N is 1.

This secondary acid generator was prepared by reacting pinanediol with p-toluenesulfonyl chloride in pyridine solution at ambient temperature for five days, as described in J. Org. Chem., 36, 412 (1971). Recrystallization from hexane containing a small amount of ethyl acetate gave the pure compound (melting point 76° C., in agreement with the aforementioned paper) in 60% yield based upon the pinanediol starting material. The structure of the product was confirmed by mass, proton NMR and $^{13}$C NMR spectroscopy.

EXAMPLE 3

Preparation of [1S*,2R*]-1-1-hydroxy-1-methyl-1,2,3,4-tetrahydronaphthalene-2-yl (±)-10-camphorsulfonate This Example illustrates the preparation of the secondary acid generator of Formula VI in which $R^{15}$ is a methyl group, $L^1$ is a hydroxyl group, $L^2$ is a (7,7-dimethylbicyclo [2.2.1]heptan-2-onyl)methylsulfonyl group and m is 1.

Part A

Preparation of 3,4-dihydro-1-methylnaphthalene

α-Tetralone was reacted with methylmagnesium iodide as described in J. Org. Chem., 26, 4165 (1961), without isolation of the intermediate 1-methyl-1-tetralol, to give the desired product, after distillation, in 68% yield as a colorless oil, boiling point 55–57° C. at 0.8 mm Hg.

Part B

Preparation of [1S*,2R*]-1-methyl-1,2,3,4-tetrahydronaphthalene-1,2-diol

Oxidation of the 3,4-dihydro-1-methylnaphthalene prepared in Part A above with trimethylamine N-oxide dihydrate in the presence of pyridine and a catalytic amount of osmium tetroxide in t-butanol/water under reflux, followed by recrystallization from ethyl acetate/hexane, as described in J. Indian Chem. Soc., 59, 1139 (1987) gave 1-methyltetralin-cis-1,2-diol, melting point 75° C., in 80% yield. The structure of the product was confirmed by mass, proton NMR and $^{13}C$ NMR spectroscopy. The product had an $R_f$ of 0.5 upon thin layer chromatography on silica gel with 2% methanol/dichloromethane as eluant.

Part C

Preparation of [1S*,2R*]-1-hydroxy-1-methyl-1,2,3,4-tetrahydronaphthalene-2-yl (±)-10-camphorsulfonate

[1S*,2R*]-1-Methyl-1,2,3,4-tetrahydronaphthalene-1,2-diol (6.6 g, 37 mmoles, prepared as in Part B above) and 4-dimethylaminopyridine (0.1 g) were dissolved in pyridine (60 mL) and the resultant solution mixed with (±)-10-camphorsulfonyl chloride (10.8 g, 43 mmoles). The temperature of the resultant reaction mixture rose rapidly from 25° C. to 45° C., with subsequent precipitation of pyridine hydrochloride. The reaction mixture was allowed to cool to ambient temperature and then stirred at this temperature for 16 hours. The pyridine solvent was then removed on a rotary evaporator and the resultant semi-solid, amber-colored residue was treated with 50 mL of water and 200 mL of diethyl ether. The ether phase was separated and washed with 0.1 N hydrochloric acid until the aqueous phase remained acidic, then further washed with dilute sodium bicarbonate solution and with water. The ether extract was then dried over anhydrous sodium sulfate, and concentrated after decantation from the desiccant. Upon addition of petroleum ether (35–60° C. fraction) to the ether extract, crystallization occurred and the desired product was obtained as an off-white solid, melting point approximately 105° C. (sintering at 90° C.), yield 7.5 g, 52% based upon the diol starting material. The product had an $R_f$ of 0.4 upon thin layer chromatography on silica gel with 1% methanol/dichloromethane as eluant.

The mass spectrum in the presence of sodium iodide showed the expected parent peak at 415 (392+23). The proton and carbon-13 NMR spectra were found to be complex because of the presence of two diastereoisomers in the product. Using the CH-multiplet corresponding to the tosylate methyl group at δ=5 as a reference point, the integrations of signals in the NMR spectra were found to be consistent with the presence of 28 protons, as expected for the empirical formula ($C_{21}H_{28}O_5S$). Two sulfoester carbons at 84.5 and 85.2 ppm, and two tertiary C—OH carbons at 71.06 and 71.15 ppm, were also consistent with the expected mixture of diastereoisomers.

EXAMPLE 4

Preparation of [1S*,2R*]-1hydroxy-1-methyl-1,2,3,4-tetrahydronaphthalene-2-yl N,N-dimethylsulfamate This example illustrates the preparation of a secondary acid generator of Formula VI in which $R^{15}$ is a methyl group, $L^1$ is a hydroxyl group, $L^2$ is a N,N-dimethylaminosulfonyl group and m is 1.

To a solution of [1S*,2R*]-1-methyl-1,2,3,4-tetrahydronaphthalene-1,2-diol (350 mg, 2.0 mmole, prepared as described in Example 3, Part B above) in dimethylformamide (2.5 mL) was added at 0° C. 60 mg (2.5 mmole) of sodium hydride. The resultant mixture was stirred at 20° C. for 45 minutes, then cooled to 0° C. A solution of N,N-dimethylsulfamoyl chloride (320 mg, 2.22 mmole) in DMF (1 mL) was added dropwise over a period of 10 minutes and the resultant reaction mixture allowed to stir at 0° C. for 30 minutes, then at 20° C. overnight. The reaction mixture was then quenched into cold water (65 mL) containing acetic acid (3 drops) and the resultant mixture extracted twice with 10 mL aliquots of dichloromethane. The organic extracts were combined, washed with water (50 mL) and evaporated to give a pale brown oil, which was chromatographed on silica gel, eluting successively with hexanes containing 20% and 25% ethyl acetate, to give the pure desired product as a colorless oil weighing 255 mg (45% yield), and exhibiting the expected mass spectrum and proton and carbon NMR spectra.

EXAMPLE 5

Preparation of [1S*,2S*]-1-hydroxy-1-(4-methoxyhenyl)cyclohex-2-yl p-toluenesulfonate This Example illustrates the preparation of the secondary acid generator of Formula V in which $R^{11}$ is a p-methoxyphenyl group, $L^1$ is a hydroxyl group, $L^2$ is a p-methylphenylsulfonyl group, m is 1 and N is 0.

Part A

Preparation of [1S*,2S*]-1-methoxyphenyl)cyclohexane-1,2-diol

This preparation is based upon the method described in Davies et al., Tetrahedron, 18, 751 (1962).

p-Methoxyphenylmagnesium bromide was prepared by adding magnesium ribbon (5.9 g, 0.242 mole) to p-bromoanisole (27.6 g, 0.147 mole) dissolved in anhydrous ether (250 mL). After 2 hours refluxing, the resultant reagent was cooled to 0–5° C. and adipoin (2-hydroxycyclohexanone dimer) (10.3 g, 0.045 mole) was added slowly through a solid addition funnel, 50 mL of additional ether being used to rinse adhering solid from the neck of the flask into the reaction mixture. The reaction mixture was then refluxed for 1 hour, allowed to cool to ambient temperature and stirred overnight at this temperature. Saturated aqueous ammonium chloride solution (50 mL) was added, the solids which precipitated were filtered off, and the ether phase of the filtrate separated from the aqueous phase. The ether phase was then washed once with water (50 mL), dried over anhydrous sodium sulfate and concentrated under reduced pressure to give the crude desired product as an off-white solid (9.5 g). Recrystallization from ether/pentane gave a first crop (5.65 g) of crystals of pure product, and a second crop (2.90 g) was obtained from the mother liquor; the product had melting point 102–103° C. and the total yield was 8.55 g, 43% based upon the adipoin starting material. Both crops of crystals gave identical proton and $^{13}$C NMR spectra and the FAB mass spectrum in the presence of sodium iodide showed the expected parent peak at 246 (M+1+Na$^+$).

Part B

Preparation of [1S*,2S*]-1-hydroxy-1-(4-methoxyphenyl)cyclohex-2-yl p-toluenesulfonate

[1S*,2S*]-1-(4-methoxyphenyl)cyclohexane-1,2-diol (2.02 g, 9.1 mmole, prepared in Part A above) was dissolved in pyridine (25 mL) and cooled in ice bath, then p-toluenesulfonyl chloride (2.71 g, 14.3 mmole) was added in portions. The resultant orange solution was allowed to warm to ambient temperature over a period of about 1 hours, stirred at ambient temperature overnight, and then added slowly to ice-water with stirring. The resultant gray solids were filtered and dried to yield the desired crude product (1.073 g). Recrystallization from benzene/petroleum ether gave the purified product as pale straw-colored plates.(0.88 g, 0.23 mmole, 25% yield based upon the diol starting material). Treatment of a saturated benzene solution of this purified product with charcoal and recrystallization by addition of petroleum ether to the benzene solution resulted in a product in the form of white plates.

The structure of the product was confirmed by mass, proton NMR and $^{13}$C NMR spectroscopy; the FAB mass spectrum showed a parent peak at 399 (M+Na$^+$).

EXAMPLE 6

Preparation of 3-hydroxy-3-phenyl-cyclohex-1-yl diphenylphosphate

This Example illustrates the preparation of a secondary acid generator of Formula VIII in which $R^7$ is a phenyl group, $L^1$ is a hydroxyl group, $L^2$ is a diphenylphosphate group, $R^6$, $R^8$ and $R^{10}$ are each a hydrogen atom, and $R^5$ and $R^9$ are each a methylene group, the carbon atoms of $R^5$ and $R^9$ being bonded to one another, so that $R^5$ and $R^9$, together with the four intervening carbon atoms, form a six-membered ring.

Part A

Preparation of 3-hydroxycyclohexanone

A 3 L, three-necked, round-bottomed flask was charged with 1,3-cyclohexanediol (42.5 g, 0.366 mole) and acetone (1.5 L). This mixture was stirred until dissolution was complete, then the resultant solution was cooled to below 5° C. in an ice bath. The solution was then vigorously stirred while Jones reagent (92 mL [prepared by dissolving 14 g of chromium trioxide in 100 mL of water, then adding 12.2 mL of concentrated sulfuric acid with stirring]) was added dropwise over a period of 1 hour, while maintaining the temperature below 5° C. The resultant mixture was stirred for an additional hour at room temperature, then concentrated. The concentrated product was diluted with diethyl ether (1 L) and stirred for an additional 12 hours over excess powdered sodium carbonate. The resultant mixture was filtered and chromatographed on silica gel, eluting with diethyl ether. The eluate was concentrated and distilled, and the distilled product was collected as a clear oil (12.7 g, 30.6% yield) boiling at 115° C. under 2.5 mm Hg pressure.

Carbon-13 NMR (in deuterochloroform): δ210.9, 69.6, 50.3, 40.9, 32.6 and 20.7

Part B

Preparation of 1-phenyl-1,3-dihydroxycyclohexane

Phenyl magnesium bromide (43.8 mL of a 1M solution in ether) was added dropwise at room temperature to a stirred solution of 3-hydroxycyclohexanone (5.0 g, 0.044 mole) in 300 mL diethyl ether. The reaction mixture was stirred at room temperature for one hour, then refluxed for two hours, and finally stirred overnight at room temperature.

Saturated aqueous ammonium chloride solution (60 mL) was added dropwise to the reaction mixture with constant stirring. The resulting suspension was filtered and the filtrate was washed with brine (100 mL). The organic layer was dried over sodium sulfate, filtered, and concentrated to give a crude product, which was triturated with pentane, then recrystallized from dichloromethane/pentane (1:2 v/v) to give the desired product (4.3 g, 51% yield) as a white crystalline solid.

Carbon-13 NMR (in deuterochloroform): δ148.4, 128.3, 126.8, 124.4, 74.5, 67.9, 42.9, 38.5, 32.2 and 16.2.

Part C

Preparation of 3-hydroxy-3-phenylcyclohex-1-yl diphenylphosphate

1-Phenyl-1,3-dihydroxycyclohexane (192 mg, 1.0 mmole) was dissolved in dry pyridine (2 mL) in a 10 mL round-bottomed flask. The resultant solution was stirred and cooled in an ice bath, then diphenylphosphochloridate (269 mg, 1.1 mmole) was added, followed by 4-dimethylaminopyridine (10 mg). The resultant solution was stirred in the ice bath for 10 minutes during which time a precipitate formed. The ice bath was then removed and the reaction mixture stirred at room temperature overnight.

The reaction mixture was then poured into a stirred aqueous buffer of pH 3 (100 mL) and the resultant mixture adjusted to pH 3 by the addition of approximately 1.5 mL of concentrated hydrochloric acid. The mixture was then extracted twice with 30 mL aliquots of diethyl ether, and the ether extracts were combined and washed with brine (50 mL), dried over sodium sulfate, filtered, and concentrated to produce a crude product as a thick yellow oil.

The crude product was chromatographed on silica gel (eluting with dichloromethane containing a proportion of ethyl acetate increasing from 2 to 5 percent during the elution). The product containing fractions of the eluate were combined, evaporated, and stored under vacuum overnight to give the desired product (197 mg, 46% yield) as a thick colorless oil.

Carbon-13 NMR (in deuterochloroform): δ150.52, 150.43, 146.84, 129.92, 128.37, 127.09, 125.53, 124.82, 120.18, 120.12, 120.05, 77.97, 77.89, 72.85, 43.00, 42.94, 37.94, 37.94, 31.06, 31.00 and 16.84

EXAMPLE 7

Preparation of (1-methoxy-1,2,3,4-tetrahydronaphthalen-1-yl)methyl diphenylphosphate This Example illustrates the preparation of a secondary acid generator of Formula I in which $R^1$ is a methyl group, $R^2$ is hydrogen, and each group Ar is a phenyl group.

Part A

Preparation of spiro[3,4-dihydro-1(2H)naphthalene, 2'-oxirane]

A three-necked, 200-mL, round-bottomed flask equipped with an overhead stirrer, an addition funnel, and a reflux condenser was charged with trimethylsulphonium bromide (4.7 g, 30 mmole), acetonitrile (30 mL), potassium hydroxide (7.9 g, 140 mmole) and water (0.1 mL). With stirring, the reaction mixture was heated by means of an oil bath (maintained at 60° C.) for five minutes before the addition of a solution of α-tetralone (2.8 g, 19.2 mmole) in acetonitrile (6 mL). The oil bath temperature was maintained at 60° C. while the reaction was monitored by thin layer chromatography (TLC), using a 4:1 v/v hexanes:diethyl ether as eluant. After 3 hours, the reaction mixture was cooled to room temperature, diluted with ether (150 mL), and filtered to remove insoluble salts. These salts were thoroughly washed with ether to ensure complete recovery of the desired product. The ether was then removed and the resulting residue was dissolved in hexanes and extracted with water (3×25 mL aliquots). The organic layer was then dried over anhydrous magnesium sulfate, and filtered to remove the drying agent; the hexanes were then removed to yield a viscous oil, which was used without further purification in Part B below.

Part B

Preparation of 1-hydroxymethyl-1-methoxy-1,2,3,4-tetrahydronaphthalene

The crude product prepared in Part A above was dissolved in dry methanol (15 mL) in an oven-dried, nitrogen-flushed reaction vessel equipped with a magnetic stirring bar and a rubber septum cap. The reaction vessel was purged with nitrogen, and cooled in an ice/water bath. A solution of trifluoroacetic acid in methanol (2.0 mL of a 0.2 N solution) was added to the stirred solution; following this addition, TLC (using the same eluant as in Part A) indicated complete consumption of the starting material in 5–10 minutes. After volatiles had been removed by evaporation, the resulting crude oil was dissolved in hexanes/ether and extracted with water until neutral to pH paper. The crude oil was next purified by column chromatography on silica gel using hexanes/ether as eluant. Following the elution of a minor component, the desired product was obtained after concentration as a viscous oil (2.5 g, 68% over 2 steps).

Proton NMR (in deuterochloroform): δ7.1–7.4 (4H, multiplet), 3.6 (2H, multiplet), 3.1 (3H, singlet), 2.7 (3H, multiplet), and 1.8–2.3 (4H, multiplet).

Carbon-13 NMR (in deuterochloroform): δ139.60, 136.21, 128.84, 127.52, 127.18, 126.04, 79.19, 69.83, 50.13, 29.76, 25.83, 20.95.

IR (KBr): 3500, 3050, 2900, 1500, 1190, 1120 and 755 $cm^{-1}$.

Part C

Preparation of (1-methoxy-1,2,3,4-tetrahydronaphthalen-1-yl)methyl diphenylphosphate A dry, nitrogen-flushed reaction vessel was charged with dry pyridine (10 mL) and 1-hydroxymethyl-1-methoxy-1,2,3,4-tetrahydronaphthalene (500 mg) prepared in Part B above. The solution was cooled using an ice/water bath, and diphenyl chlorophosphate (1.1 g, 4.1 mmole) was added directly to the reaction vessel. With stirring overnight, a thick white precipitate formed. TLC (using a 9:1 v/v dichloromethane/diethyl ether mixture as eluant) indicated complete consumption of the starting material and the formation of a new material which ran near the solvent front. The reaction mixture was poured into cold water (25 mL) and extracted with ether (3×20 mL aliquots). The organic layers were combined and extracted with dilute (pH~3–4) aqueous hydrochloric acid (3×10 mL aliquots), and then with water (3×20 mL aliquots). The organic layer was dried over anhydrous magnesium sulfate, filtered, and concentrated. Final purification by column chromatography on silica gel using hexanes/ether as eluant yielded the desired secondary acid generator as an oil (800 mg, 72% yield).

Proton NMR (in deuterochloroform): δ7.1–7.5 (14H, multiplet), 4.37 (2H, doublet), 3.1 (3H, singlet), 2.7 (2H, multiplet), 1.8–2.3 (4H, multiplet).

Carbon-13 NMR (in deuterochloroform): δ150.7, 139.4, 134.7, 129.7, 129.1, 128.0, 127.2, 126.2, 125.3, 120.2, 77.2, 73.8, 50.5, 29.6, 26.7, 20.5.

EXAMPLE 8

Preparation of 3-methoxy-3-(4-phenylphenyl)but-1-yl bis(4-phenylphenyl)phosphate This Example illustrates the preparation of a secondary acid generator of Formula II in which n is 2, $R^1$ and $R^3$ are each a methyl group, and each group Ar is a 4-phenylphenyl group.

Part A

Preparation of 1-methyl-1-(4-phenylphenyl)oxetane

Trimethylsulfoxonium iodide (8.80 g, 40 mmole) was suspended in t-butanol (80 mL) in a 250 mL round-bottomed flask. The resultant suspension was stirred at 50° C. and a warm solution of potassium t-butoxide (4.5 g, 40 mmole) in t-butanol (50 mL) was added. The resultant mixture was stirred at 50° C. for 30 minutes, then a warm solution of 4-acetylbiphenyl (2.0 g, 10 mmole) in t-butanol (25 mL) was added dropwise with constant stirring. The mixture thus formed was stirred at 50° C. for 18 hours, then cooled to room temperature and poured into stirred water (1 L). The resulting mixture was extracted with diethyl ether (3×75 mL aliquots). The ether extracts were combined and washed with brine (75 mL), dried over anhydrous sodium sulfate, filtered, and concentrated to give the crude desired product (2.3 g, 100% yield) as a yellow oil.

Carbon-13 NMR (in deuterochloroform): δ147.24, 140.96, 139.70, 128.79, 127.24, 127.14, 127.06, 124.17, 86.61, 64.64, 35.67, 30.68.

Part B

Preparation of 3-methoxy-3-(4-phenylphenyl)butan-1-ol

1-Methyl-1-(4-phenylphenyl)oxetane (2.2 g, 9.8 mmole, prepared in Part A above) was dissolved in methanol (100 mL) in a 500 mL round-bottomed flask. The resultant solution was stirred and trifluoroacetic acid (3 drops) was added. The solution was stirred under nitrogen for three hours, then poured into stirred water (500 mL). The resultant mixture was extracted with diethyl ether (3×200 mL aliquots). The ether extracts were combined and washed with brine (100 mL), dried over anhydrous sodium sulfate, filtered, and concentrated to yield the desired crude product.

The crude product was purified by column chromatography on silica gel (eluting with dichloromethane to 10% diethyl ether in dichloromethane). The product-containing fractions were combined, evaporated, and placed under vacuum overnight to give the desired product (1.6 g, 64% yield) as a white crystalline solid. A sample recrystallized from hexane melted at 45.5–47° C.

Carbon-13 NMR (in deuterochloroform): δ143.43, 140.66, 139.97, 128.81, 127.34, 127.09, 127.06, 126.41, 80.74, 59.77, 50.61, 45.42, 22.59.

Part C

Preparation of 3-methoxy-3-(4-phenylphenyl)butan-1-yl bis(4-phenylphenyl)phoshate 3-Methoxy-3-(4-phenylphenyl)butan-1-ol (256 mg, 1 mmole, prepared in Part B above) and triethylamine (110 mg, 1.09 mmole) in acetonitrile (1 mL) were added dropwise to a solution of phosphorus oxychloride (168 mg, 1.1 mmole) in acetonitrile (3 mL) at room temperature. The resultant reaction mixture was stirred for 2 hours, during which time a white precipitate formed. A solution of 4-phenylphenol (340 mg, 2 mmole) and triethylamine (220 mg, 2.18 mmole) in acetonitrile (2 mL) was then added dropwise, and the reaction mixture was heated at reflux for 2 hours, then cooled and diluted with dichloromethane. The organic layer was washed sequentially with 1M sulfuric acid and 1M aqueous sodium hydroxide. (A slowly-separating emulsion formed during the hydroxide wash). The organic layer was separated, dried over anhydrous sodium sulfate, and evaporated to give a crude product, which was purified by medium-pressure chromatography on silica gel with 40–60% ether/hexanes as eluant to give the desired product as an oil, which was induced to crystallize from hexanes with ether trituration. (Alternatively, the product could be crystallized from isopropanol). The yield of crystalline material (melting point. 67–71° C.) was 311 mg (49%). The structure of this compound was confirmed by proton NMR spectroscopy.

EXAMPLE 9

Preparation of 3-methoxy-3-(4-phenylphenyl)but-1-yl p-toluenesulfonate

To a solution of 3-methoxy-3-(4-phenylphenyl)butan-1-ol (2.04 g, 8.0 mmole, prepared in Example 8, Part B above) and triethylamine (1.51 g, 15 mmole) in acetone (10 mL) at 0° was added in one portion a solution of p-toluenesulfonyl chloride (2.85 g, 15 mmole) in acetone (4 mL). The resultant suspension was warmed to 20° C. and stirred at that temperature for 14 hours, then diluted with diethyl ether (40 mL). The resultant precipitate (triethylamine hydrochloride) was removed by filtration and the filtrate was evaporated to dryness to give a crude product, which was purified by column chromatography on silica gel, eluting with a 1:1 v/v hexanes:dichloromethane mixture to give the desired product (2.87 g, 87% yield) of colorless solid. Less pure fractions were combined to provide an additional 0.147 g of colorless solid which was crystallized from hexanes (10 mL), furnishing colorless fine matted needles weighing 0.070 g; melting point 69–70.5° C.

EXAMPLE 10

Preparation of 2-methoxy-2-[4-(4-]phenylphenoxy) phenyl]but-1-diphenylphosphate

This Example illustrates the preparation of a secondary acid generator of Formula II in which n is 1, $R^1$ is a methyl group, $R^3$ is an ethyl group, the group Ar attached to the same carbon atom as the group $R^3$ is a 4-(4-phenylphenoxy) phenyl group, and the other two groups Ar are phenyl groups.

Part A

Preparation of 4-(4-phenylphenoxy)propiophenone

A 100 mL, three-necked, round-bottomed flask equipped with a magnetic stirrer, a Dean-Stark trap, and a nitrogen inlet was charged with 4-phenylphenol (1.70 g, 10 mmole), 4'-fluoropropiophenone (1.52 g, 10 mmole), anhydrous potassium carbonate (1.60 g, 11.6 mmole), N,N-dimethylacetamide (20 mL), and toluene (25 mL). Under a nitrogen atmosphere and with stirring, the resultant mixture was heated at 150° C. for 12 hours. Most of the toluene plus some water was removed through the Dean-Stark trap during the first few hours. The reaction mixture was then poured into water (300 mL), and the precipitated solid was collected by filtration and washed with water to give a crude product, which was recrystallized from hexanes to give the desired product white crystals (2.21 g, 73% yield, melting point 124–126° C.).

Proton NMR (in deuterochloroform): δ7.96 (2H, doublet), 7.58 (4H, double doublet), 7.44 (2H, triplet), 7.38 (1H, triplet), 7.12 (2H, doublet), 7.04 (2H, doublet), 2.99 (2H, quartet), and 1.22 (3H, triplet).

Carbon-13 NMR (in deuterochloroform): δ199.50, 161.68, 155.09, 140.29, 137.64, 131.76, 130.28, 128.87, 128.72, 127.31, 126.99, 120.34, 117.46, 31.61, and 8.38.

Part B

Preparation of 1-ethyl-1-[4-(4-phenylphenoxy) phenyl]oxirane

A 100 mL, three-necked, round-bottomed flask equipped with a magnetic stirrer and a nitrogen inlet was charged with trimethylsulfonium bromide (2.5 g, 15.9 mmole), sodium methoxide (0.9 g, 16.7 mmole), and acetonitrile (15 mL). The mixture was stirred under nitrogen for 30 minutes, and then 4-(4-phenyl-phenoxy)propiophenone (2.0 g, 6.6 mmole) in acetonitrile (25 mL) was added. After stirring for five hours at 60° C., the mixture was cooled to room temperature and concentrated. The residue was extracted with water/dichloromethane, and the combined organic layers were dried and concentrated to yield the desired product (2.1 g, 100% yield, melting point 62–64° C.).

Proton NMR (in deuterochloroform): δ7.58 (4H, multiplet), 7.43 (1H, triplet), 7.36 (4H, multiplet), 7.04 (2H, doublet), 7.02 (2H, doublet), 3.00 (1H, doublet), 2.79 (1H, doublet), 2.19 (1H, multiplet), 1.82 (1H, multiplet), and 0.98 (3H, triplet).

Carbon-13 NMR (in deuterochloroforon): δ156.69, 156.47, 140.52, 136.41, 134.99, 128.80, 128.46, 127.59, 127.07, 126.92, 119.11, 118.71, 60.74, 55.37, 28.39, and 9.10.

Part C

Preparation of 2-methoxy-2-[4-(4-phenylphenoxy) phenyl]-butan-1-ol

To a 200 mL beaker containing 1-ethyl-1-[4-(4-phenylphenoxy)phenyl]oxirane (2.1 g, 6.6 mmole) and methanol (100 mL) was added trifluoroacetic acid (0.5 mL). The resultant mixture was stirred for ten minutes, by which time the epoxide had dissolved completely, and TLC analysis (using a 1:1 v/v hexanes/ether mixture as eluant) indicated completion of the reaction. The resultant solution was concentrated to yield a solid product (2.2 g, 95% yield) which was used in Part D below without firther purification.

Proton NMR (in deuterochloroform): δ7.59 (4H, multiplet), 7.43 (1H, triplet), 7.35 (4H, multiplet), 7.05 (2H, doublet), 7.03 (2H, doublet), 3.84 (2H, double doublet), 3.56 (1H, singlet), 3.20 (3H, singlet), 1.92 (2H, multiplet), and 0.82 (3H, triplet).

Carbon-13 NMR (in deuterochloroform): δ156.55, 156.49, 140.51, 136.56, 135.75, 128.83, 128.50, 128.10, 127.12, 126.94, 119.32, 118.53, 81.43, 64.50, 49.92, 26.79, and 7.66.

Part D

Preparation of 2-methoxy-2-[4-(4-phenylphenoxy) phenyl]but-1-yl diphenylphosphate A 50-mL round-bottomed flask was charged with 2-methoxy-2-[4-(4-phenylphenoxy)phenyl]butan-1-ol (2.2 g, 6.3 mmole) and pyridine (10 mL). Diphenyl chlorophosphate (4.0 mL, 19.3 mmole) was added while stirring, and the resultant mixture was allowed to stand for 16 hours at room temperature. Water was then added and the mixture was extracted twice with dichloromethane. The organic layers were combined, dried and concentrated, and the resultant residue was crystallized from ether/hexanes. The white crystalline compound produced was then further purified by column chromatography on silica gel using dichloromethane as eluant, followed by recrystallization from ether/hexanes to yield the pure desired product (2.36 g, 64% yield, melting point 58–60° C.).

Proton NMR (in deuterochloroform): δ7.0–7.6 (23H, multiplet), 4.48 (2H, multiplet), 3.15 (3H, singlet), 1.95 (2H, multiplet), and 0.86 (3H, triplet).

Carbon-13 NMR (in deuterochloroform): δ156.52, 156.50, 140.50, 136.51, 135.45, 129.76, 128.82, 128.48, 128.21, 127.10, 126.92, 125.36, 120.10, 120.03, 119.25, 118.43, 79.76, 70.17, 50.13, 26.03, and 7.16.

EXAMPLE 11

Preparation of 2-methoxy-2-[4-(4-methoxyphenyl)phenyl]but-1-yl diphenylphosphate This Example illustrates the preparation of a secondary acid generator of Formula II in which n is 1, $R^1$ is a methyl group, $R^3$ is an ethyl group, the group Ar attached to the same carbon atom as the group $R^3$ is a 4-(4-methoxyphenyl)phenyl group, and the other two groups Ar are phenyl groups.

Part A

Preparation of 4-(4-methoxyphenyl)propiophenone

An oven-dried, nitrogen-swept, 200-mL reaction vessel equipped with a magnetic stir bar, a pressure-equalizing addition funnel, a thermometer, and a rubber septum cap was charged with 4-methoxybiphenyl (5.0 g, 27.1 mmole), dichloromethane (30 mL), and anhydrous aluminum chloride (4.2 g, 31.5 mmole). The addition funnel was charged with propionyl chloride (2.7 g, 29.2 mmole) in dichloromethane (5 mL). The reaction vessel was cooled in an ice/salt bath to bring the flask temperature to about 0° C. while maintaining an atmosphere of dry nitrogen in the vessel. The acid chloride solution was the added dropwise over a period of 20 minutes maintaining a reaction temperature of about 5° C. During this time the initial dark brown solution turned greenish in color. After the addition had been completed, the reaction mixture was allowed to warm to room temperature, stirred for an additional 1.5 hours, and then carefully added to a hydrochloric acid/ice mixture. The resultant mixture was allowed to stand overnight, then extracted with dichloromethane (4×25 mL aliquots). The organic layers were combined and extracted with water until the water was neutral to pH paper. The organic layer was then dried over anhydrous magnesium sulfate, filtered, and concentrated to yield an off-white crystalline solid. Recrystallization from ethanol provided the desired product (4.42 g, 68% yield, melting point 146–147° C.).

Proton NMR (in deuterochloroform): δ8.05 (2H, doublet), 7.60 (4H, double doublet), 7.00 (2H, doublet), 3.85 ( 3H, singlet), 3.03 (2H, quartet), and 1.28 (3H, triplet).

Carbon-13 NMR (in deuterochloroform): δ200.45, 159.87, 145.13, 135.04, 132.32, 128.62, 128.36, 126.61, 114.40, 55.39, 31.80, and 8.36.

Part B

Preparation of 1-ethyl-1-[4-(4-methoxyphenyl)phenyl]oxirane 4-(4-Methoxyphenyl)propiophenone (2.0 g, 8.3 mmole, prepared in Part A above) was heated at 60° C. with trimethylsulphonium bromide (2.0 g, 12.7 mmole), and potassium hydroxide (4.5 g, 80 mmole) in acetonitrile (20 mL) with a trace of water (2 drops from a pipette). Initially the reaction Mixture turned yellow in color. This color faded with time and the reaction mixture was nearly colorless after three hours, when the reaction was complete. The reaction mixture was cooled to room temperature, diluted with ethyl ether, and filtered to remove insoluble matter. The filtrate was concentrated, and the resulting residue was dissolved in hexanes and extracted with water (3×25 mL aliquots). The hexane layer was then dried over anhydrous magnesium sulfate, filtered, and concentrated to give the product (1.82 g, 86% yield) as a white crystalline solid which was used without further purification in Part C below.

Proton NMR (in deuterochloroform): δ7.5 (4H, doublet), 7.4 (2H, doublet), 7.0 (2H, doublet), 3.9 ( 3H, singlet), 2.9 (2H, double doublet), 2.0 (2H, doublet of multiplets), and 1.0 (3H, triplet).

Carbon-13 NMR (in deuterochloroform): δ159.18, 139.91, 138.43, 133.28, 128.09, 126.61, 126.45, 114.23, 60.85, 55.52, 55.36, 28.25, and 9.11.

Part C

Preparation of 2-methoxy-2-[4-(4-methoxyphenyl)phenyl]butan-1-ol

1-Ethyl-1-[4-(4-methoxyphenyl)phenyl]oxirane (1.8 g, 7.1 mmole, prepared in Part B above) was dissolved in dry dichloromethane (5 mL) in an oven-dried, nitrogen-flushed reaction vessel equipped with a magnetic stir bar and a rubber septum cap. To the resultant solution was added dry methanol (20 mL), and the reaction mixture was then cooled in an ice/water bath. Next, trifluoroacetic acid in methanol (2.0 mL of a 0.2 N solution) was added and the solution was stirred overnight allowing the solution to warm to room temperature. After concentration of the solution, a white crystalline solid was obtained which was recrystallized from hexanes to give the product (1.2 g, 59% yield, melting point 108–109° C.).

Proton NMR (in deuterochloroform): δ7.54 (4H, double doublet), 7.38 (2H, doublet), 6.95 (2H, doublet), 3.88 (2H, doublet), 3.84 (3H, singlet), 3.18 (3H, singlet), 1.94 (2H, multiplet), 1.78 (1H, triplet), and 0.83 (3H, triplet).

Carbon-13 NMR (in deuterochloroform): δ159.18, 139.71, 139.63, 133.19, 128.06, 127.02, 126.59, 114.23, 81.50, 64.62, 55.35, 50.00, 26.76, and 7.65.

Part D

Preparation of 2-methoxy-2-[4-(4-methoxyphenyl)phenyl]but-1-yl diphenylphosphate A 50-mL round-bottomed flask was charged with 2-methoxy-2-[4-(4-methoxyphenyl)phenyl]butan-1-ol (500 mg, 1.75 mmole, prepared in Part C above) and pyridine (5 mL). Diphenyl chlorophosphate (1.0 mL, 4.82 mmole) was added while stirring, and the resultant mixture was allowed to stand for 16 hours at room temperature. Water was then added and the mixture was extracted twice with dichloromethane. The organic layers were combined, dried and concentrated, and the resultant residue was purified by column chromatography on silica gel using dichloromethane as eluant, followed by crystallization from ether/hexanes to give the pure desired product (581 mg, 64% yield, melting point 57–59° C.).

Proton NMR (in deuterochloroform): δ7.0–7.6 (18H, multiplet), 4.48 (2H, multiplet), 3.85 (3H, singlet), 3.15 (3H, singlet), 1.95 (2H, double multiplet), and 0.86 (3H, triplet).

Carbon-13 NMR (in deuterochloroform): δ159.22, 150.44, 139.81, 138.97, 133.12, 129.71, 128.05, 127.12, 126.49, 125.30, 120.05, 114.25, 79.94, 70.07, 55.36, 50.21, 26.13, and 7.17.

EXAMPLE 12

Imaging

This Example illustrates the effectiveness of various secondary acid generators in the process of the present invention.

Two coating fluids were prepared as follows:

Fluid A:

A superacid precursor ([4-[2-hydroxytetradecan-1-yloxy]phenyl]phenyliodonium hexafluoroantimonate, 30 mg), an indicator sensitizing dye (2,4,6-tris(2,4-dimethoxypheny) pyridinium hexafluoroantimonate, prepared as described in U.S. Pat. No. 5,441,850, 30 mg) and a hydroquinone fixing agent (2,5-bis(2,4,4-trimethylpent-2-yl)-1,4-dihydroxybenzene, 15 mg) were dissolved in a solution of polystyrene (average molecular weight 45,000, available from Aldrich Chemical Company, Milwaukee, Wis., 3.0 g of a 10 percent w/w solution in 2-butanone). The acid amplifier being tested (9.0 mg) was dissolved in the resultant solution (300 mg) to form Coating Fluid A.

Fluid B:

The aforementioned Copikem 35magenta indicator image dye (2.5 g) and an amine base (1-(3-aminoprop-1-yl) imidazole, 0.275 g) were added to a solution of an acrylate binder (Acrysol B-82, supplied by Rohm and Haas, Philadelphia, Pa. 19104, 7.5 g in 40 g of ethyl acetate) and the resultant solution was added to a solution of poly(vinyl alcohol) (Vinol 540, supplied by Air Products Corporation, Allentown Pa., 28.6 g of a 7 percent solution in water). Water (55 g) was added and the mixture was then sonicated, after which evaporation of ethyl acetate gave Coating Fluid B.

To prepare an imaging medium, Coating Fluid A was coated on to a reflective poly(ethylene terephthalate) base (Melinex reflective film base, supplied by ICI Americas, Inc., Wilmington Del.) using a #8 coating rod, and allowed to dry to form an acid-generating layer. Coating Fluid B was then coated over the acid-generating layer using a #6 coating rod, and allowed to dry to form a color-change layer.

The imaging medium thus formed was exposed to ultraviolet radiation (10 units) from a nuArc 26–1K Mercury Exposure System (supplied by nuarc Company, Inc., 6200 West Howard Street, Nile Ill. 60648) through a step wedge (Stouffer T4105). The films were then heated at 60° C. for 30 seconds and thereafter at 120° C. for 30 seconds. Green reflection optical densities of the exposed films were measured using an X-Rite 310 photographic densitiometer (supplied by X-Rite, Inc., Grandville Mich.) equipped with the appropriate filter (Status A).

The secondary acid generator was also tested for thermal stability as follows. The secondary acid generator (5 mg) and the aforementioned Copikem 35 (8.5 mg) were dissolved in 250 mg of a 10% solution of polystyrene (average molecular weight 280,000, available from Aldrich Chemical Company, Milwaukee, Wis.) in 2-butanone to form a coating fluid which was coated onto the aforementioned Melinex film base using a #16 wire-wound coating rod. The resultant film was laminated to a piece of transparent film base coated with a release layer (a silicone coating on poly(ethylene terephthalate) base of 0.5 mil thickness, available from Release International, 1400 Harvester Road, West Chicago, Ill. 60185) at 120° C. and approximately 1 ft/minute (approximately 5 mm/sec.). The purpose of this lamination was to prevent evaporation of the secondary acid generator during prolonged heating at elevated temperatures.

Portions of the laminated structure were heated for various times at 120° C. Any acid generated by thermal decomposition of the secondary acid generator caused a color change in the indicator dye which was proportional to the amount of acid generated. This color change was measured using the aforementioned X-Rite 310 photographic densitiometer.

The density increase (green) measured after 8 minutes storage at 120° C. is shown in Table 2 below.

The secondary acid generators tested by this procedure included a control oxalate secondary acid generator, 3-(4-benzyloxybenzyloxyoxalyloxy)but-1-yl 4-benzyloxybenzyl oxalate, of the formula:

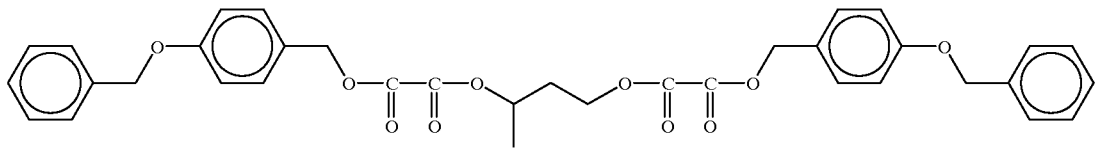

those produced in Examples 1, 2, 3 and 5 above, and related compounds of the Formulae XI and XII below. The results are shown in Table 2 below.

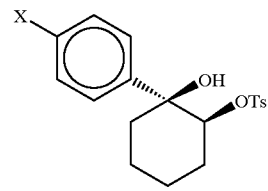

(XI)

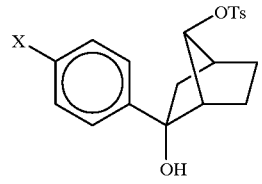

(XII)

TABLE 2

| Example/Formula | X | $D_{min}$ | $D_{max}$ | Energy to reach $D_{max}$ | Slope OD $(cm^2/mJ)$ | Density increase |
|---|---|---|---|---|---|---|
| Control | — | 0.06 | 1.15 | 0.93 | 2.24 | 0 |
| Ex. 1/XII | Me | 0.11 | 1.48 | 0.29 | 9.89 | 0 |
| XII | H | 0.09 | 1.68 | 2.56 | 1.46 | — |
| XII | Cl | 0.11 | 1.25 | 0.83 | 1.94 | — |

TABLE 2-continued

| Example/Formula | X | $D_{min}$ | $D_{max}$ | Energy to reach $D_{max}$ (cm$^2$/mJ) | Slope OD (cm$^2$/mJ) | Density increase |
|---|---|---|---|---|---|---|
| XII* | 3-Cl | 0.11 | 1.40 | 2.81 | 0.95 | — |
| XII | CF$_3$ | 0.09 | 1.25 | 4.34 | 0.49 | — |
| XII* | 3,5-diCl | 0.14 | 1.41 | 15.06 | 0.15 | 0 |
| Ex. 2 | — | 0.09 | 1.01 | 9.50 | 0.27 | 0.09 |
| Ex. 3 | — | 0.08 | 1.46 | 1.17 | 2.26 | 0.20 |
| Ex. 5/XI | OMe | 0.09 | 1.67 | 0.29 | 9.73 | 2.03 |
| XI | OPh | 0.08 | 1.20 | 1.61 | 1.58 | 0.42 |
| XI | Me | 0.07 | 1.41 | 3.96 | 0.80 | 0.47 |
| XI | H | 0.08 | 1.78 | 7.38 | 0.34 | 0.17 |
| XI | Cl | 0.08 | 1.31 | 15.06 | 0.09 | 0.07 |

*These compounds deviate slightly from Formula XII, being substituted on the 3- or 3- and 5-carbon atoms of the phenyl group.

From Table 2 it will be seen that some of the compounds of the present invention (e.g., the compounds of Examples 1 and 5) are significantly more sensitive than the control (9.89 and 9.73 cm$^2$/mJ, respectively, compared with 2.24 cm$^2$/mJ for the control). Variation of the substituent (X in Table 2) on a phenyl group adjacent the hydroxyl trigger changes the sensitivity of the secondary acid generator.

What is claimed is:

1. A secondary acid generator of the formula:

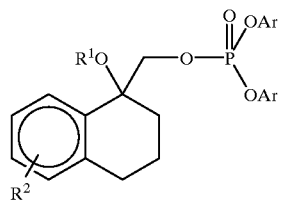

wherein Ar is an aryl group, with the two aryl groups being the same or different, R$^1$ is an alkyl or cycloalkyl group, and R$^2$ represents one or more hydrogen atoms or alkyl, aryl, alkoxy or aryloxy groups on the benzene ring.

2. A secondary acid generator according to claim 1, wherein R$^1$ is an alkyl group, and each group Ar is a phenyl, 4-methoxyphenyl, 4-phenylphenyl or 4-(4-phenylphenoxy) phenyl group.

3. A secondary acid generator according to claim 2 wherein R$^1$ is a methyl group, each group Ar is a phenyl group, and the benzene ring is unsubstituted, namely (1-methoxy-1,2,3,4-tetrahydronaphthen-1-yl)methyl diphenylphosphate.

4. A secondary acid generator of the formula:

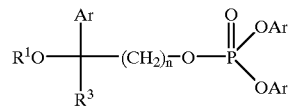

wherein Ar is an aryl group, with the three aryl groups being the same or different, R$^1$ is an alkyl or cycloalkyl group, R$^3$ is an alkyl or cycloalkyl group, and n is 1 or 2.

5. A secondary acid generator according to claim 4, wherein R$^1$ is an alkyl group, R$^2$ is an alkyl group, and each group Ar is a phenyl, 4-methoxyphenyl, 4-phenylphenyl or 4-(4-phenylphenoxy)phenyl group.

6. A secondary acid generator according to claim 5 wherein:

(a) n is 2, R$^1$ and R$^3$ are each a methyl group, and each group Ar is a 4-phenylphenyl group, namely 3-methoxy-3-(4-phenylphenyl)but-1-yl bis(4-phenylphenyl)phosphate;

(b) n is 1, R$^1$ is a methyl group, R$^3$ is an ethyl group, the group Ar attached to the same carbon atom as the group R$^3$ is a 4-(4-phenylphenoxy)phenyl group, and the other two groups Ar are phenyl groups, namely 2-methoxy-2-[4-(4-phenylphenoxy)phenyl]but-1-yl diphenylphosphate; or (c) n is 1, R$^1$ is a methyl group, R$^3$ is an ethyl group, the group Ar attached to the same carbon atom as the group R$^3$ is a 4-methoxyphenyl group, and the other two groups Ar are phenyl groups, namely 2-methoxy-2-[4-(4-methoxyphenyl)phenyl]but-1-yl diphenylphosphate.

* * * * *